US007952152B2

(12) United States Patent
Yamazaki et al.

(10) Patent No.: US 7,952,152 B2
(45) Date of Patent: May 31, 2011

(54) SEMICONDUCTOR DEVICE AND FABRICATION METHOD THEREOF

(75) Inventors: Shunpei Yamazaki, Tokyo (JP); Hideomi Suzawa, Kanagawa (JP); Koji Ono, Kanagawa (JP); Yoshihiro Kusuyama, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 12/849,866

(22) Filed: Aug. 4, 2010

(65) Prior Publication Data
US 2011/0024757 A1 Feb. 3, 2011

Related U.S. Application Data

(60) Continuation of application No. 11/743,189, filed on May 2, 2007, now Pat. No. 7,804,142, which is a division of application No. 10/105,282, filed on Mar. 26, 2002, now Pat. No. 7,238,600.

(30) Foreign Application Priority Data

Mar. 27, 2001 (JP) ................................ 2001-091275

(51) Int. Cl.
H01L 21/02 (2006.01)

(52) U.S. Cl. ..... 257/408; 257/66; 257/59; 257/E27.132; 438/149

(58) Field of Classification Search ................... 257/408, 257/66, 59, 412, 368, 413, 755, 54; 438/149
See application file for complete search history.

(56) References Cited

U.S. PATENT DOCUMENTS

| 4,905,066 A | 2/1990 | Dohjo et al. |
| 5,276,347 A | 1/1994 | Wei et al. |
| 5,508,209 A | 4/1996 | Zhang et al. |
| 5,585,815 A | 12/1996 | Nakashima et al. |
| 5,612,234 A | 3/1997 | Ha |
| 5,641,983 A | 6/1997 | Kato et al. |
| 5,643,826 A | 7/1997 | Ohtani et al. |
| 5,852,481 A | 12/1998 | Hwang |
| 5,923,962 A | 7/1999 | Ohtani et al. |
| 5,953,582 A | 9/1999 | Yudasaka et al. |
| 6,031,290 A | 2/2000 | Miyazaki et al. |
| 6,150,249 A | 11/2000 | Lee et al. |
| 6,165,824 A | 12/2000 | Takano et al. |
| 6,180,439 B1 | 1/2001 | Yamazaki et al. |
| 6,197,624 B1 | 3/2001 | Yamazaki |

(Continued)

FOREIGN PATENT DOCUMENTS
EP 0082012 A2 6/1983
(Continued)

OTHER PUBLICATIONS

Australian Patent Office Search Report and Written Opinion of Counterpart Singapore Patent Application No. 200201696-2, Feb. 16, 2004, 9 pages.

(Continued)

Primary Examiner — Thanh V Pham
Assistant Examiner — Mark A Laurenzi, III
(74) Attorney, Agent, or Firm — Fish & Richardson P.C.

(57) ABSTRACT

For forming a gate electrode, a conductive film with low resistance including Al or a material containing Al as its main component and a conductive film with low contact resistance for preventing diffusion of Al into a semiconductor layer are laminated, and the gate electrode is fabricated by using an apparatus which is capable of performing etching treatment at high speed.

7 Claims, 14 Drawing Sheets

U.S. PATENT DOCUMENTS

| | | | |
|---|---|---|---|
| 6,259,138 B1 | 7/2001 | Ohtani et al. |
| 6,274,887 B1 | 8/2001 | Yamazaki et al. |
| 6,277,679 B1 | 8/2001 | Ohtani |
| 6,285,042 B1 | 9/2001 | Ohtani et al. |
| 6,335,541 B1 | 1/2002 | Ohtani et al. |
| 6,365,917 B1 | 4/2002 | Yamazaki |
| 6,399,960 B1 | 6/2002 | Yamazaki et al. |
| 6,420,758 B1 | 7/2002 | Nakajima |
| 6,469,317 B1 | 10/2002 | Yamazaki et al. |
| 6,475,836 B1 | 11/2002 | Suzawa et al. |
| 6,489,952 B1 | 12/2002 | Tanaka et al. |
| 6,501,098 B2 | 12/2002 | Yamazaki |
| 6,512,271 B1 | 1/2003 | Yamazaki et al. |
| 6,515,336 B1 | 2/2003 | Suzawa et al. |
| 6,518,594 B1 | 2/2003 | Nakajima et al. |
| 6,529,251 B2 | 3/2003 | Hibino et al. |
| 6,545,359 B1 | 4/2003 | Ohtani et al. |
| 6,558,993 B2 | 5/2003 | Ohtani et al. |
| 6,586,766 B2 | 7/2003 | Yamazaki et al. |
| 6,599,785 B2 | 7/2003 | Hamada et al. |
| 6,617,644 B1 | 9/2003 | Yamazaki et al. |
| 6,635,505 B2 | 10/2003 | Tanaka et al. |
| 6,646,287 B1 | 11/2003 | Ono et al. |
| 6,657,260 B2 | 12/2003 | Yamazaki et al. |
| 6,784,037 B2 | 8/2004 | Yamazaki et al. |
| 6,791,112 B2 | 9/2004 | Yamazaki et al. |
| 6,803,601 B2 | 10/2004 | Nakajima |
| 6,809,021 B2 | 10/2004 | Ohtani et al. |
| 6,815,273 B2 | 11/2004 | Nakajima et al. |
| 6,891,195 B2 | 5/2005 | Yamazaki et al. |
| 6,909,114 B1 | 6/2005 | Yamazaki |
| 6,977,394 B2 | 12/2005 | Yamazaki et al. |
| 2001/0025960 A1 | 10/2001 | Ohtani et al. |
| 2001/0030322 A1 | 10/2001 | Yamazaki et al. |
| 2001/0030342 A1 | 10/2001 | Ohnishi et al. |
| 2001/0038065 A1 | 11/2001 | Kimura |
| 2001/0041392 A1 | 11/2001 | Suzawa et al. |
| 2001/0049197 A1 | 12/2001 | Yamazaki et al. |
| 2001/0052950 A1 | 12/2001 | Yamazaki et al. |
| 2001/0055841 A1 | 12/2001 | Yamazaki et al. |
| 2002/0001886 A1 | 1/2002 | Ohtani |
| 2002/0006705 A1 | 1/2002 | Suzawa et al. |
| 2002/0013022 A1 | 1/2002 | Yamazaki et al. |
| 2002/0016028 A1 | 2/2002 | Arao et al. |
| 2002/0017685 A1 | 2/2002 | Kasahara et al. |
| 2002/0070382 A1 | 6/2002 | Yamazaki et al. |
| 2002/0110941 A1 | 8/2002 | Yamazaki et al. |
| 2002/0139980 A1 | 10/2002 | Yamazaki |
| 2002/0142554 A1 | 10/2002 | Nakajima |
| 2002/0149016 A1 | 10/2002 | Yamazaki et al. |
| 2002/0158288 A1 | 10/2002 | Yamazaki et al. |
| 2003/0122132 A1 | 7/2003 | Yamazaki |
| 2003/0211662 A1 | 11/2003 | Yamazaki et al. |
| 2004/0051142 A1 | 3/2004 | Yamazaki et al. |
| 2004/0115851 A1 | 6/2004 | Tanaka et al. |
| 2005/0017242 A1 | 1/2005 | Yamazaki et al. |
| 2005/0051773 A1 | 3/2005 | Nakajima |
| 2005/0056837 A1 | 3/2005 | Ohtani et al. |
| 2005/0104068 A1 | 5/2005 | Yamazaki |
| 2005/0110016 A1 | 5/2005 | Yamazaki |
| 2005/0161675 A1 | 7/2005 | Kimura |
| 2005/0189543 A1 | 9/2005 | Yamazaki et al. |
| 2005/0205868 A1 | 9/2005 | Yamazaki et al. |
| 2006/0051906 A1 | 3/2006 | Yamazaki |

FOREIGN PATENT DOCUMENTS

| | | |
|---|---|---|
| EP | 1071124 A2 | 1/2001 |
| JP | 6148685 A | 5/1994 |
| JP | 7130652 A | 5/1995 |
| JP | 7235680 A | 9/1995 |
| JP | 8274336 A | 10/1996 |
| JP | 10247735 A | 9/1998 |
| JP | 2000241832 A | 9/2000 |
| JP | 2001-035808 A | 2/2001 |

OTHER PUBLICATIONS

Ghandhi, S. "VLSI Fabrication Principles—Silicon and Gallium Arsenide," A Wiley-Interscience Publication, Second Edition, 1994, pp. 552-553.

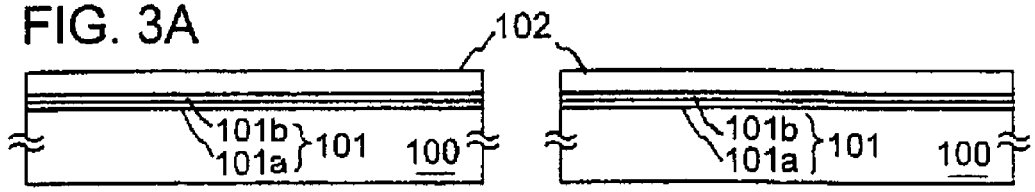
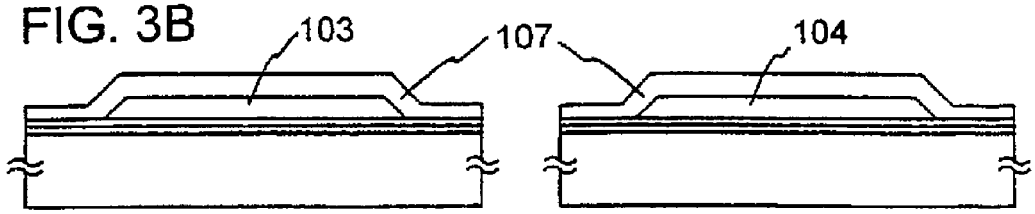
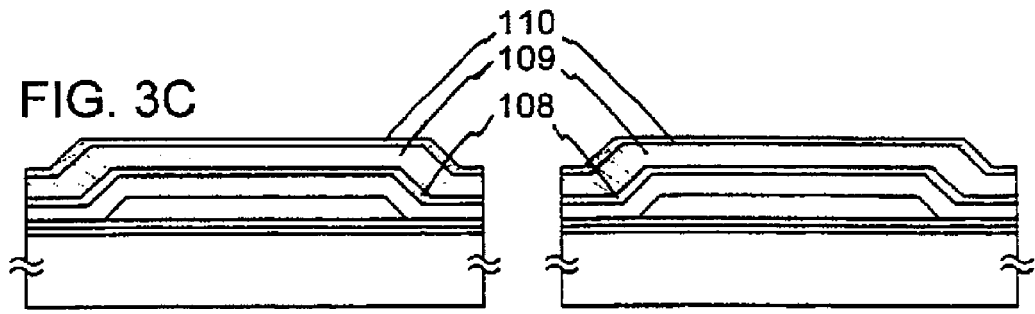
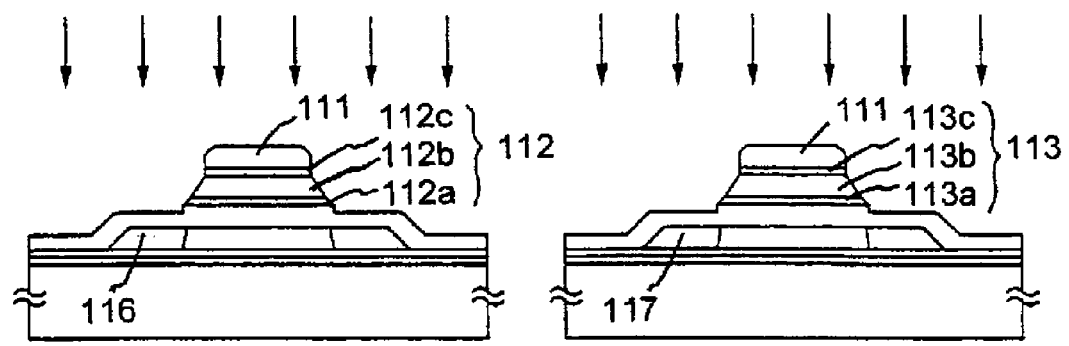
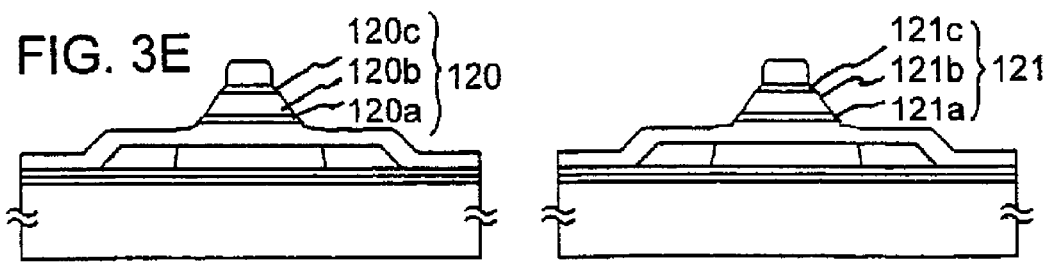

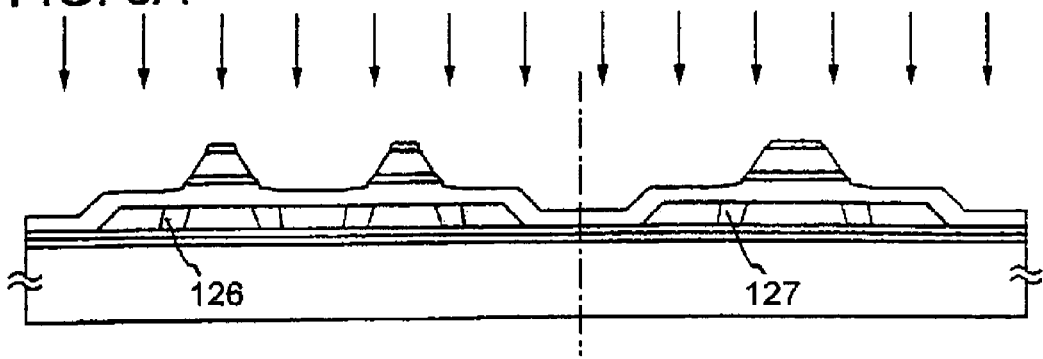
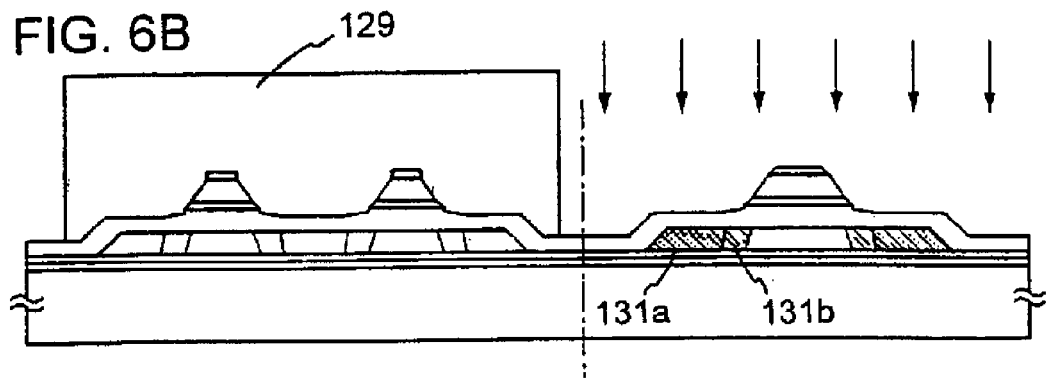
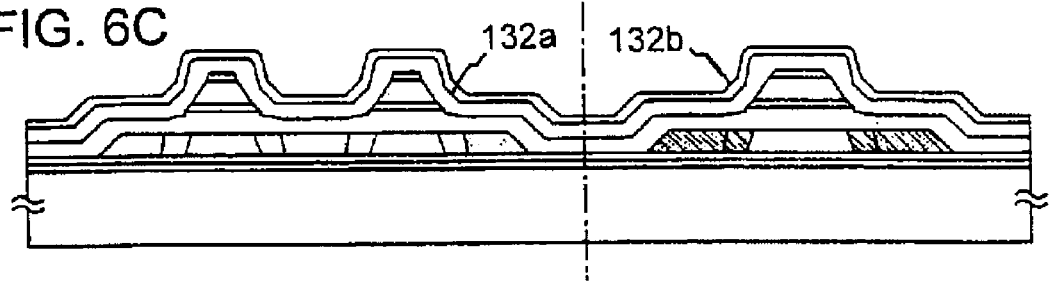
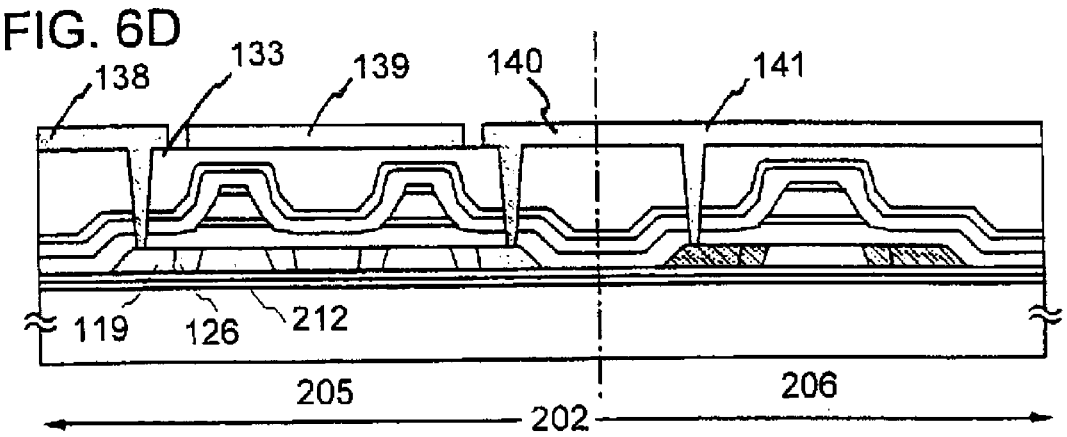

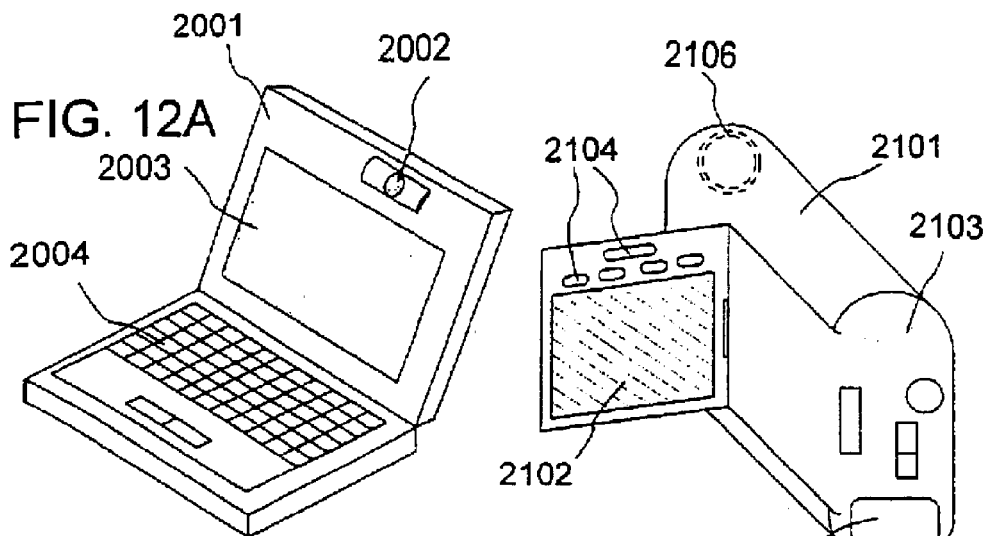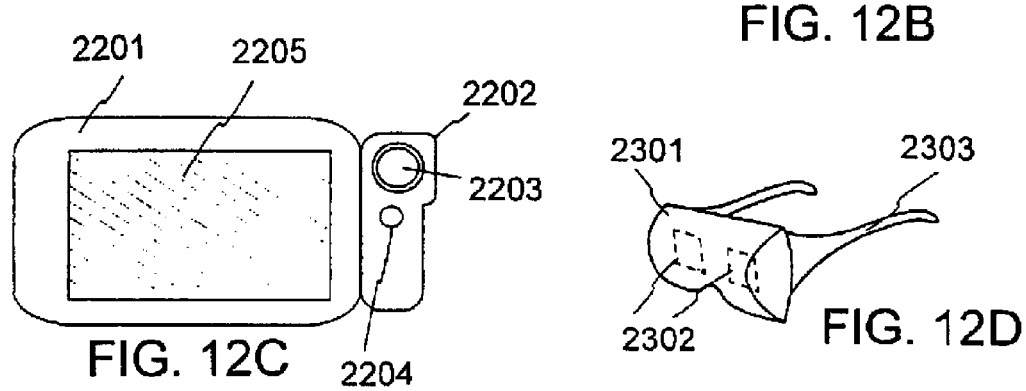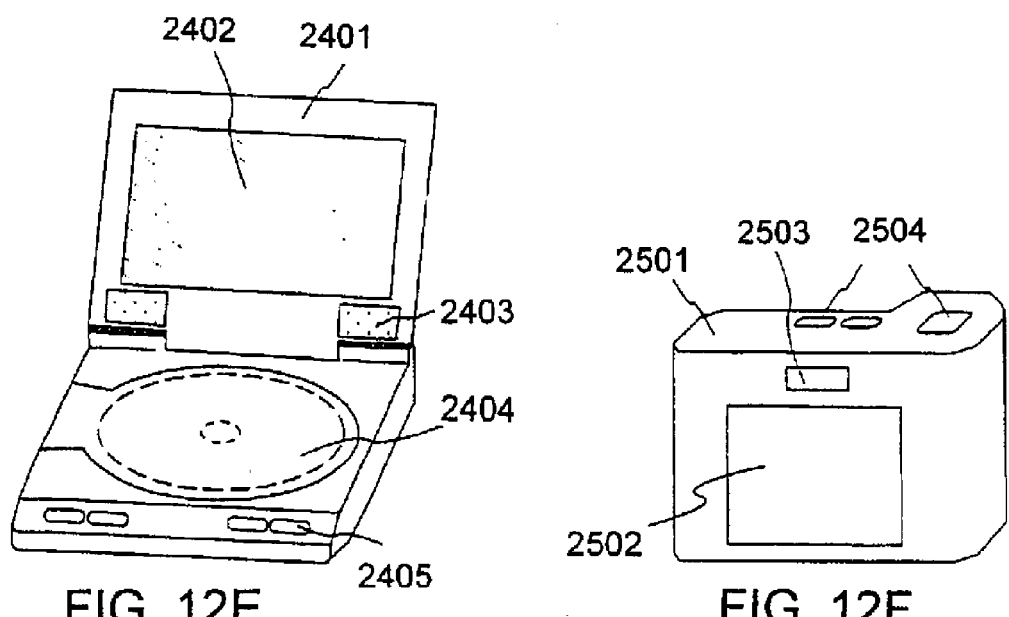

SEMICONDUCTOR DEVICE AND FABRICATION METHOD THEREOF

CROSS-REFERENCE TO RELATED APPLICATIONS

This application is a continuation of U.S. application Ser. No. 11/743,189, filed May 2, 2007, now allowed, which is a divisional of U.S. application Ser. No. 10/105,282, filed Mar. 26, 2002, now U.S. Pat. No. 7,238,600, which claims the benefit of a foreign priority application filed in Japan as Serial No. 2001-091275 on Mar. 27, 2001, all of which are incorporated by reference.

BACKGROUND OF THE INVENTION

1. Field of the Invention

The present invention relates to semiconductor devices including a drive circuit as formed using a semiconductor element with a semiconductor film as an active layer (a semiconductor layer including a channel formation region, a source region and a drain region) and also to a manufacturing method of the same. Note that typical examples of the semiconductor element are transistors including, although not limited to, field effect transistors such as metal oxide semiconductor (MOS) transistors and thin-film transistors (TFTs). In addition, the present invention relates in particular to large size display devices (more than 20 inches) wherein resistance of wiring lead becomes a problem in supplying signal, and also to a fabrication method thereof.

2. Description of the Related Art

To realize reduction in weight and power consumption of portable information equipment such as a mobile telephone and a notebook PC, small-size or middle-size liquid crystal display devices have generally been used as display units thereof due to merits of such liquid crystal display devices.

Further, it is becoming a more active trend to enlarge the market of the liquid crystal display device up to a television (TV) and also to design a TV at home by using the liquid crystal display device in place of a traditional cathode ray tube (CRT). However, it is necessary to simultaneously satisfy higher fidelity and higher brightness in addition to the enlargement to realize a liquid crystal TV.

Further, with an increase in size of a display device, the number and length of wirings and resistivities of the wirings increase accordingly. An increase in wiring resistance would cause a delay in transmitting signals toward lead terminate ends to in turn badly affect the resultant displays. Therefore, a technique for reducing the wiring resistance becomes inevitable in order to widely spread the liquid crystal display devices to ordinary homes.

So far, as the technique for reducing wiring resistance, a method of widening line widths of the wirings and increasing the film thickness of the wirings have been considered, and actually, it has been realized to reducing the wiring resistance. However, the former is encountered with an enlargement of element areas in a pixel portion due to widening of the lead widths to result in decreasing an aperture ratio and to make it impossible to obtain higher brightness required. Alternatively, with the latter method, the increase in film thickness of wirings results in an increase in difference between a layer formed under the wirings and a layer formed on the wirings to cause production yields to decrease due to problems such as disconnection as a result of reduction of coating properties in fabricating insulating films and metal films for electrodes.

Additionally, although there is a method of using aluminum (Al) or copper (Cu) as materials with low resistance for wirings, which suffer from defects of less corrosion resistivity and less thermal resistivity. It occurs as problems that projections such as hillocks and whiskers or the like are formed by thermal treatment, and that aluminum atoms behave to diffuse into a channel formation region to result in operation defects of TFTs or degradation in TFT characteristics. In this way, while it is not easy to form a suitable gate electrode of a TFT by using the above-noted metal materials, no materials are less in resistance than aluminum (Al) or copper (Cu). The above serves as a problem against producing a liquid crystal display device with a large screen.

In this way, the above-stated problem becomes more appreciable with increasing performance required for a semiconductor device which has a plurality of integrated circuits such as an active matrix type liquid crystal display devices.

SUMMARY OF THE INVENTION

The present invention is performed in view of the problem stated above, and the object is to provide, in a semiconductor device typically represented by an active-matrix type liquid crystal display device which has a circuit using semiconductor elements, a technique for realizing low resistivity of wirings required for enlargement and higher precision without increasing the number of steps in the manufacturing process, and further provide a method for fabricating a semiconductor device at low temperatures (temperatures lower than or equal to the distortion point of a glass substrate) to use glass substrates with a low cost.

The invention has the following structure. A conductive film containing W as its main component is used for a first layer to form a gate electrode in order to prevent aluminum of the gate electrode from transpiring and diffusing into a channel formation region with a film which contains Al as its main component and is low in resistance as a second layer and a film which contains Ti as its main component, to fabricate the gate electrode with a laminate structure of the above materials by using an apparatus which is capable of performing etching treatment at high speeds.

Additionally it is required that a TFT disposed in each of a variety of types of circuits be fabricated as a TFT in accordance with the function of the circuit. For example, it is desirable that the TFT provided in a driver circuit required to achieve high-speed operations be designed to have a specific structure with great emphasis on an increase in operation speed and at the same time on suppression of any possible degradation as an appreciable problem due to hot carrier injection. It is known as such structure that an LDD region as provided between a channel formation region and a drain region has a concentration in order that the concentration of an impurity element gradually gets higher toward the drain region. With the structure, the effect of relaxing electric field becomes more remarkable in a depletion layer adjacent to the drain region.

In order to form the LDD region with the above-noted concentration gradient of the impurity element, the present invention use a method of accelerating by electric fields an ionized impurity element for giving one conductivity type to pass through a gate insulating film and then add into a semiconductor layer. In addition, with the present invention, a gate electrode with a tapered shape is formed to have a thickness gradually increasing from an end portion toward inside by etching, and it is considered that the impurity element is somewhat added to the semiconductor layer through the tapered shape. In the present invention, the LDD region is formed in order that the concentration of the impurity element changes in a direction along the channel length of a TFT, without increasing the number of steps (without increasing the number of masks).

BRIEF DESCRIPTION OF THE DRAWINGS

FIGS. 3A-3E are diagrams showing one example for reduction to practice of the invention;

FIGS. 6A-6D are diagrams showing one example for implementation of this invention;

FIGS. 12A-12F are diagrams showing examples of electrical equipment;

DESCRIPTION OF THE PREFERRED EMBODIMENTS

Figure 1A:
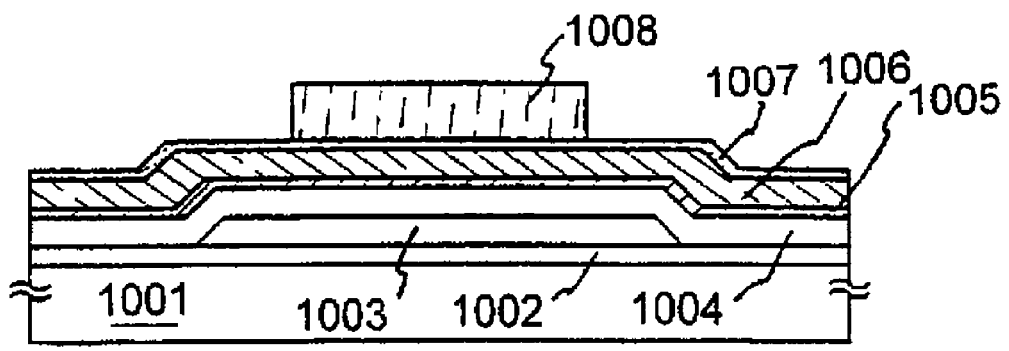
FIGS. 1A-1D are diagrams showing one preferred embodiment of the invention.
Figure 1B:
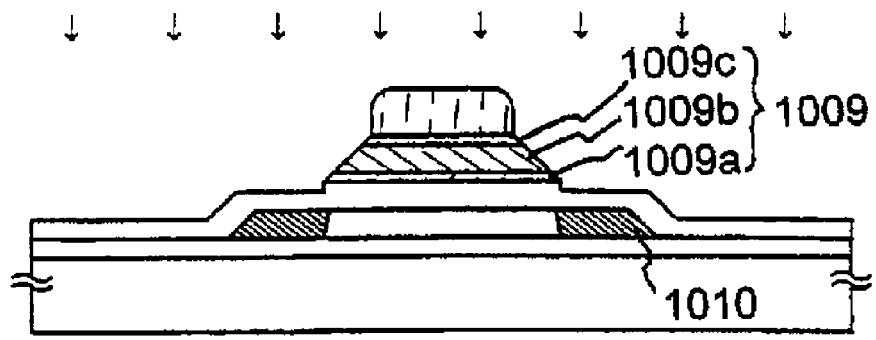
Figure 1C:
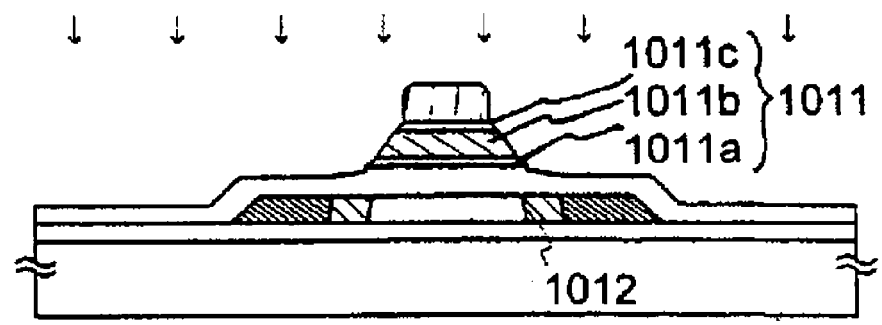
Figure 1D:
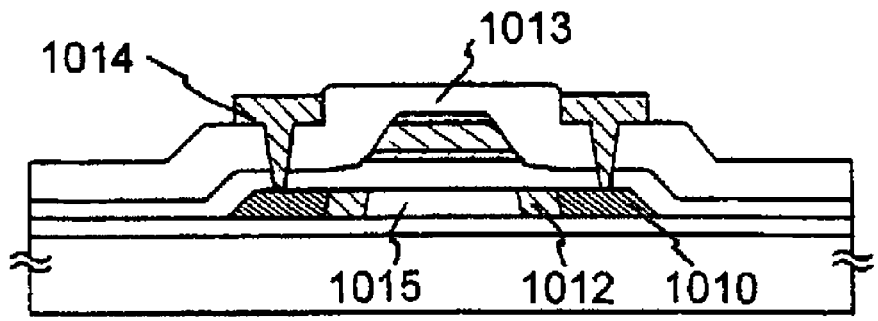
Figure 2:
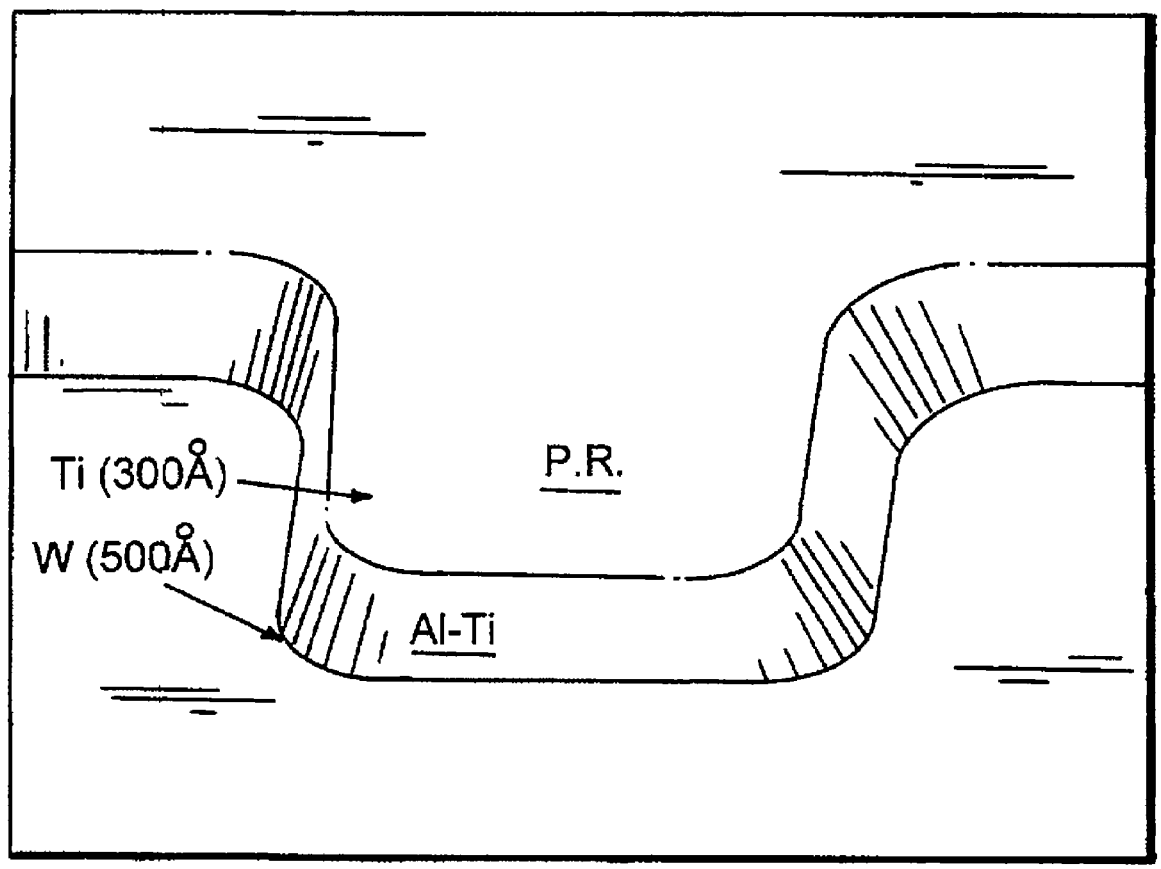
FIG. 2 is an SEM photograph showing an observation result of a laminated conductive film as etched.

In the embodiment mode, it is described that a method of fabricating a display device that is adaptable for the enlargement and high image quality by using materials with low resistance without increasing the number of steps, with reference to FIGS. 1 and 2.

A base insulating film 1002 and a semiconductor layer 1003 are formed on a substrate 1001, and a gate insulating film 1004 with a film thickness of 40 to 150 nm is formed by plasma CVD method, sputtering method or low-pressure CVD method or the like. Then, On the gate insulating film 1004 a three-layered conductive film formed of a first conductive film 1005, a second conductive film 1006, and a third conductive film 1007 is formed, thus, a mask 1008 is formed (FIG. 1A).

The present invention employs, as a conductive film for a gate electrode, a laminate structure of a conductive film with low resistance such as Al, Cu, or one of a chemical compound material and alloy material containing an element selected from the group consisting of Al and Cu as its main component: a conductive film with excellent heat resistance such as W, Mo, Ta, or one of a chemical compound material and alloy material containing an element selected from the group consisting of W, Mo, and Ta as its main component; and a conductive film with low contact resistance such Ti, or one of a chemical compound material and alloy material containing Ti as its main component. The laminate structure of these conductive films are etched repeatedly to thereby form a gate electrode without increasing the number of masks and further to form an impurity region in a semiconductor layer to obtain a TFT with the required performance.

In etching the conductive films, the etching rate of the conductive film to be processed, the selective ratio of an insulating film for a base film to the conductive film, and so forth should be considered. If the selective ratio is small, processing becomes difficult to make it difficult to form a TFT with a desired shape becoming.

Then, in order to obtain the optimal processing method, the experiment of etching conditions was performed after preparing a sample that a sequential laminated structure on a quartz substrate of an insulating film of the same material as a gate insulating film, a tungsten film with a film thickness of 50 nm, an alloy film of aluminum and titanium (Al—Ti) with a film thickness of 500 nm, and a titanium film with a film thickness of 30 nm in the Embodiment Mode. Suppose that the tungsten film is the first conductive film 1005, the alloy film of aluminum and titanium (Al—Ti) is the second conductive film 1006, and the titanium film is the third conductive film 1007, for the purpose of convenience.

First, $BCl_3$, $Cl_2$ and $O_2$ are used as etching gas and a gas flow rate ratio thereof is set at 65/10/5 sccm, and RF (13.56 MHz) electrical power of 450 W is supplied to a coiled electrode at a pressure of 1.2 Pa to thereby produce a plasma and to perform etching. RF (13.56 MHz) electric power of 300 W is supplied also to the substrate side (sample stage) to apply a substantially negative self-bias voltage for the etching. Subsequently, $CF_4$, $Cl_2$ and $O_2$ are used as etching gas and a gas flow rate ratio thereof is set at 25/25/10 sccm, and RF (13.56 MHz) electrical power of 500 W is supplied to a coiled electrode at a pressure of 1.0 Pa to thereby produce a plasma and to perform etching. RF (13.56 MHz) electric power of 20 W is supplied also to the substrate side (sample stage) to apply a substantially negative self-bias voltage for the etching. A photograph observed by SEM immediately after having done the etching under the above conditions is FIG. 2. With this etching treatment, a first electrode 1009a, a second electrode 1009b and a third electrode 1009c are formed from the first conductive film, the second conductive film and the third conductive film. The laminated conductive film shown in FIG. 2 is regarded as a gate electrode 1009 with the first shape, which consists of the first electrode 1009a, second electrode 1009b and third electrode 1009c.

Then, FIG. 1B shows a schematic diagram of a state in which an impurity element that gives one conductivity type is doped in a self-alignment fashion using as a mask the first shaped gate electrode 1009 etched as shown in FIG. 2.

The first shaped gate electrode 1009 has a tapered portion at its edge, and the gate insulating film also have a portion etched from its surface to a certain degree. The impurity element for giving on conductivity type is doped through the gate insulating film into the semiconductor layer formed thereunder. In addition, it is also possible to dope the impurity element somewhat through the edge portion of the first shaped gate electrode with the taper shape and a nearby portion of the edge portion into the semiconductor layer formed thereunder. Thus, an impurity region (A) 1010 with the doped impurity at a high concentration is formed. At this time, it is considered that there is the possibility that the impurity element is doped into the semiconductor layer through the tapered portion of the first electrode 1009a and the gate insulating film to form an impurity region which overlaps the first shaped gate electrode.

Then, $BCl_3$, $Cl_2$ and $O_2$ are used as etching gas and a gas flow rate ratio thereof is set at 65/10/5 sccm, and RF (13.56 MHz) electrical power of 450 W is supplied to a coiled electrode at a pressure of 1.2 Pa to thereby produce a plasma and to perform etching. RF (13.56 MHz) electric power of 300 W is supplied also to the substrate side (sample stage) to apply a substantially negative self-bias voltage for the etching. Subsequently, $CF_4$, $Cl_2$ and $O_2$ are used as etching gas and a gas flow rate ratio thereof is set at 25/25/10 sccm, and RF (13.56 MHz) electrical power of 500 W is supplied to a coiled electrode at a pressure of 1.0 Pa to thereby produce a plasma and to perform etching. RF (13.56 MHz) electric power of 20 W is supplied also to the substrate side (sample stage) to apply a substantially negative self-bias voltage for the etching. With the etching treatment, a fourth electrode 1011a, a fifth electrode 1011b and a sixth electrode 1011c are formed from the first electrode 1009a, the second electrode 1009b and the third electrode 1009c. The laminated structure consisting of the fourth electrode 1011a, fifth electrode 1011b and sixth electrode 1011c is regarded as a second shaped gate electrode 1011.

Then, a schematic diagram of a state, in which an impurity element for giving one conductivity type is doped in a self-align fashion with the second shaped gate electrode as a mask, is shown in FIG. 1C.

In the second doping processing, the impurity element for giving one conductivity is doped, and an impurity region (B) 1012 is formed. Note that although the impurity element is added into the impurity region (A) 1010 formed by the first doping processing, the influence is negligible since the concentration in the second doping processing is low. Although the newly formed impurity region (B) 1012 is formed with the fourth electrode 1011a, fifth electrode 1011b and sixth electrode 1011c used as a mask, it is considered at this time that there is the possibility that an impurity element is doped into the semiconductor layer through the tapered portion of the fourth electrode 1011a and the gate insulating film to form of an impurity region which overlaps the second shaped gate electrode.

Thereafter, an interlayer insulating film 1013 is formed to cover the gate electrode 1011. Then, in the interlayer insulating film 1013, a contact hole that reaches a region 1010 of the semiconductor to become either a source region or a drain region. Next, a wiring lead 1014 used for electrical connection of each TFT is formed.

As stated above, with the etching method of employing gas plasma in a reduced pressure atmosphere with three layers of conductive films laminated, it becomes possible to form a gate electrode with a desired shape by changing etching conditions. Further, by doping an impurity element through the tapered portion of the gate electrode, it is possible to form in the semiconductor layer a region in which the concentration of the impurity element changes gradually.

Additionally, with respect to the inductively coupled plasma (ICP) etching method used to form the gate electrode of the present invention with conductive films with low resistance laminated, it is easy to control plasma, and thus the method is applicable also for a substrate with a large-area to be processed.

Embodiment 1

In Embodiment 1, a method for simultaneously fabricating on the same substrate both a pixel portion and TFTs (p-channel type TFT and n-channel type TFT) of a driver circuit to be provided at the periphery of the pixel portion is explained in detail with reference to FIGS. 3 to 6.

Figure 4A:
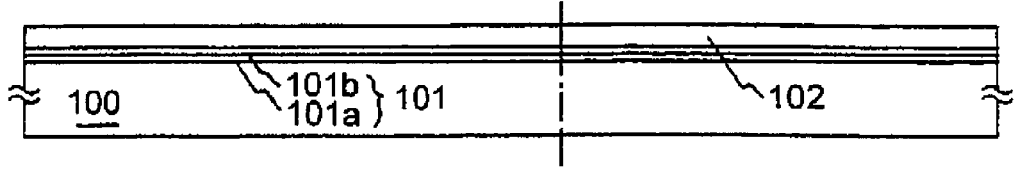
FIGS. 4A-4E are diagrams showing one example for implementation of this invention.

In FIG. 3A and FIG. 4A, it is possible to use barium borosilicate glass, alumino-borosilicate glass, quartz or other similar suitable materials as a substrate 100 although there are no particular limitations to the material thereof. On a surface of the substrate 100, an inorganic insulating film is formed as a base insulating film 101 to have a thickness of from 10 to 200 nm. A preferable example of the base insulating film is a silicon oxynitride film which is fabricated by plasma CVD method, and a first silicon oxynitride film 101a made from $SiH_4$, $NH_3$, $N_2O$ is formed to have a thickness of 50 nm and then a second silicon oxynitride film 101b made from $SiH_4$ and $N_2O$ is formed to have a thickness of 100 nm. The base insulating film 101 is provided to prevent alkali metals contained in the glass substrate from diffusing into a semiconductor film to be formed later. In the case of using quartz as the substrate, it will possibly be omitted.

As an amorphous silicon film 102 formed on the base insulating film 101, a semiconductor material containing therein silicon as a main component is used. A typical example is either an amorphous silicon film or an amorphous silicon germanium film or the like, which is formed to have a thickness of 10 to 100 nm by plasma CVD method, low-pressure CVD method or sputter method. In order to obtain good crystals, it is recommendable that the impurity concentration of oxygen and nitride or the like contained in the amorphous silicon film 102 be reduced to a level less than or equal to $5 \times 10^{18}/cm^3$, and preferably $1 \times 10^{18}/cm^3$ or less. Further, if the concentration of oxygen within the amorphous silicon film is high, it will be difficult to release catalytic elements (especially, nickel) used during a crystallization process. Therefore, it is important in order to obtain a good crystalline semiconductor film that the oxygen concentration within the amorphous silicon film 102 is set less than or equal to $5 \times 10^{18}/cm^3$, and preferably $1 \times 10^{18}/cm^3$ or below. These impurities become a factor for inhibiting crystallization of amorphous semiconductor materials, and also a factor for increasing the density of a trap center and a recombination center even after crystallization. Accordingly, it is desirable to employ CVD equipment with adaptability for ultrahigh vacuum which has mirror-surface treatment (electrolytic polishing treatment) within a reaction chamber and an oil-free vacuum evacuation system, in addition to the using high-purity material gas.

The amorphous silicon film 102 thus formed is crystallized to thereby form a crystalline semiconductor film. As a method for such crystallization, the conventional laser annealing method, thermal annealing method or RTA method are employable.

It is preferable that, prior to the crystallization processing, that hydrogen contained in the semiconductor film be released away, and it is recommendable that the crystallization be conducted after performing thermal treatment at 400 to 500° C. for about one hour to set an amount of the contained hydrogen at a level less than or equal to 5% of the number of all atoms contained in the semiconductor film, since it is possible to prevent roughness of the surface. Generally, the concentration contained hydrogen in an amorphous semiconductor film by sputter method or LPCVD method is lower than that of the amorphous silicon film formed by plasma CVD methods. Additionally, it is known that even if an amorphous semiconductor film is formed by plasma CVD method, the concentration of contained hydrogen is formed in forming at a temperature of 400° C. or higher.

In Embodiment 1, a laser annealing method is used to perform crystallization of the amorphous silicon film 102. The laser crystallization method can employ an excimer laser, YAG laser, $YVO_4$ laser or the like, which is the pulse oscillation type or alternatively the continuous emission type. In this case, the efficiency is good when laser light emitted from a laser oscillator is corrected and focused into a linear shape by an optical system to irradiate onto a semiconductor film.

While the conditions for crystallization are selected appropriately, pulse oscillation frequency is set at 300 Hz and a laser energy density is set at 100 to 800 mJ/cm$^2$ (typically, at 200 to 700 mJ/cm$^2$) in the case of using an excimer laser. Alternatively, in the case of using a YAG laser, it is preferable to use the second higher harmonic wave while the pulse oscillation frequency is set at 1 to 300 Hz with the laser energy density being set at 300 to 1,000 mJ/cm$^2$ (typically 350 to 800 mJ/cm$^2$). It may be performed to irradiate linearly corrected laser light with a width of 100 to 1000 μm, e.g., 400 μm, over the entire surface of the substrate while the overlap ratio of linear beams at this time is set at 80 to 98%.

In addition, the laser crystallization method can be performed in the atmosphere, an atmosphere of an inert gas such as nitrogen, a reduced atmosphere or the like.

Subsequently, in order to form a semiconductor layer which includes a channel formation region, a source region, and a drain region, the crystalline silicon film is etched to form semiconductor layers 103 to 106. An impurity element which gives p-type may be doped to control the threshold value (Vth) of an n-channel type TFT. Known examples of the impurity element that gives p-type to semiconductor are XIII group elements in the periodic table, such as boron (B), aluminum (Al), gallium (Ga) and the like.

Figure 4B:
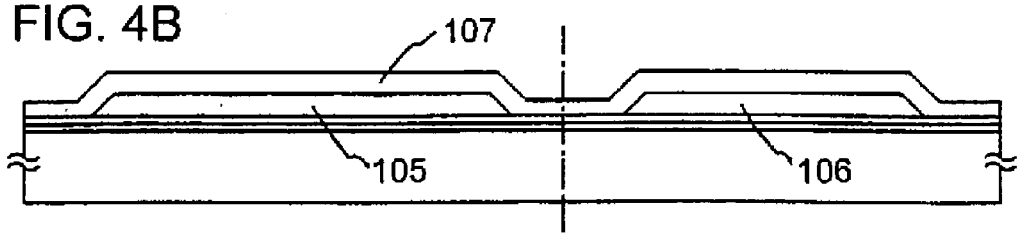
Figure 4C:
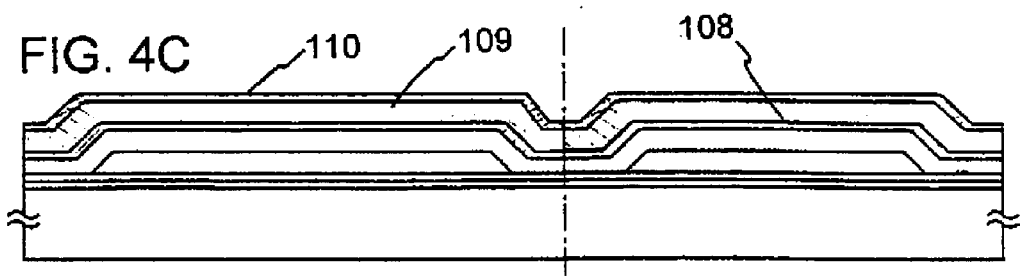

Then, a gate insulating film 107 is formed to cover the semiconductor layers 103 to 06 thus separated (FIG. 3B, FIG. 4B). The gate insulating film 107 is formed by plasma CVD method or sputter method, and is formed of a silicon-containing insulating film to have a thickness of 40 to 150 nm. The silicon-containing insulating film may be used as a single layer or to be a laminate structure.

On the gate insulating film 107, a first conductive film 108 with a film thickness of 20 to 100 nm, a second conductive film 109 with a film thickness of 100 to 400 nm, and a third conductive film 110 with a thickness of 20 to 100 nm (FIG. 3C, FIG. 4C) are formed. Although a tungsten film with a film thickness of 50 nm, an alloy film of aluminum and titanium (Al—Ti) with a thickness of 500 nm, and a titanium film with a film thickness of 30 nm are sequentially laminated on the gate insulating film 107, the first conductive film 108, the second conductive film 109, and the third conductive film 110 are not limited only to these materials.

Figure 4D:
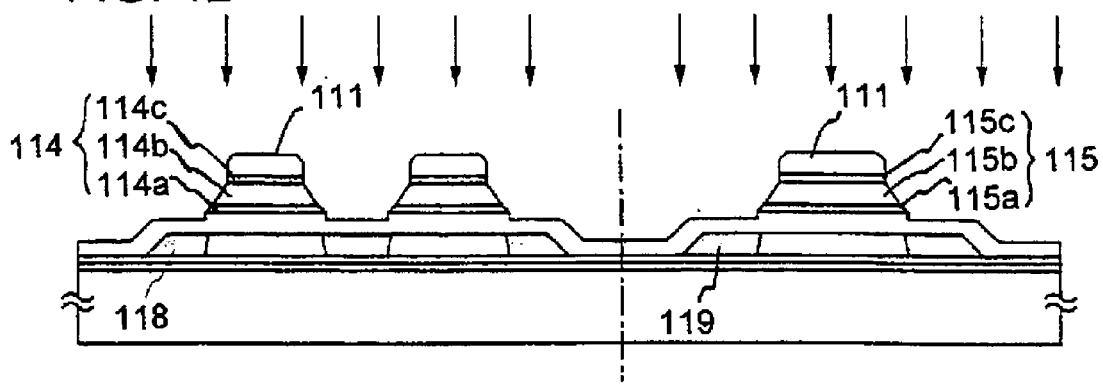
Figure 4E:
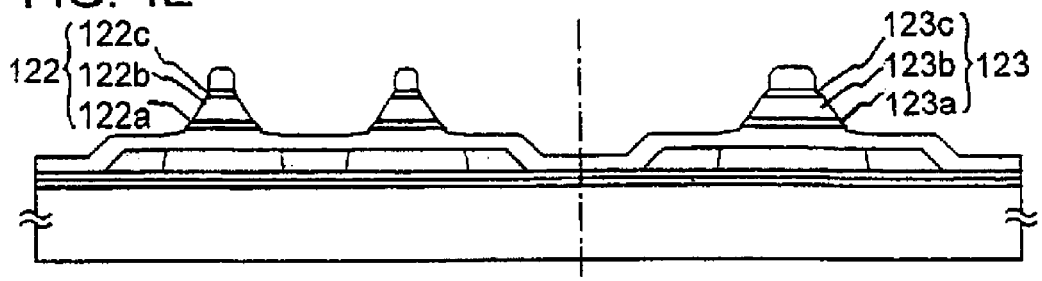

Next, as shown in FIG. 3D and FIG. 4D, a resist mask 111 is formed by exposure process, followed by executing first etching treatment for forming gate electrodes and wirings. It is preferable to use an inductively coupled plasma (ICP) etching method. As the etching gas, chlorine-based gas represented by Cl$_2$, BCl$_3$, SiCl$_4$, CCl$_4$ or the like, fluorine-based gas represented by CF$_4$, SF$_6$, NF$_3$, or O$_2$. Although there are no specific limitations to the etching gases used, it is suitable here to use BCl$_3$ and Cl$_2$ and O$_2$. For the etching, A gas flow rate of the above gas is set at 65,10/5 sccm while RF (13.56 MHz) electrical power of 450 W is applied to a coiled electrode at a pressure of 1.2 Pa to produce plasma. RF (13.56 MHz) electric power of 300 W is supplied to the substrate side (sample stage) also to apply a substantially negative self-bias voltage. With this first etching condition, the Ti film and Al—Ti film are etched to have an edge portion of the first conductive film tapered.

Thereafter, the first etching condition is changed to a second etching condition to perform etching while CF$_4$, Cl$_2$ and O$_2$ are used as etching gas, a gas flow rate is set at 25/25/10 sccm, and RF (13.56 MHz) electric power of 500 W is applied to the coiled electrode at a pressure of 1 Pa to thereby generate plasma. RF (13.56 MHz) electric power of 20 W is applied to the substrate side (specimen stage) to thereby apply a substantially negative self-bias voltage.

In this first etching treatment, it makes edge portions of the first conductive film and the second conductive film have a tapered shape to design the shape of the resist mask appropriately and apply the bias voltage to the substrate side. This tapered portion has an angle of 15 to 45°. In this way, owing to the first etching treatment, first shaped gate electrodes 112 to 115 consisting of the first electrode, the second electrode and the third electrode (first electrodes 112a to 115a, second electrodes 112b to 115b and third electrodes 112c to 115c) are thus formed (FIG. 3D and FIG. 4D). A region of the gate insulating film which is not covered by the first shaped gate electrodes 112 to 115 is etched away by about 20 to 50 nm to be thinned.

Here, a first doping process is performed to thereby dope into a semiconductor layer an impurity element for giving n-type (referred to as "n-type impurity element" hereinafter). Here, the n-type impurity element is added by ion dope method in a self-align fashion while the mask 111 used for forming the first electrodes is left and kept unchanged and also the first shaped gate electrode as is used as a mask. As the n-type impurity element, an element, such as phosphorus (P), arsenic (As) or the like, which belongs to the XV group in the periodic table is used. Here, phosphorus is used. With such an ion dope method, an n-type impurity region which contains the n-type impurity element at a concentration of $1\times10^{20}$ to $1\times10^{21}$/cm$^3$ is formed in the first impurity regions 116 to 119, an n-type impurity region (A). At this time, it is considered that there is also the possibility that an impurity element is doped into the semiconductor layer through the tapered portion of the first electrode and the gate insulating film to form an impurity region which overlaps the first shaped gate electrode.

Next, a second etching treatment is performed without removal of the resist mask 111. As etching gas, chlorine-based gases represented by Cl$_2$, BCl$_3$, SiCl$_4$, CCl$_4$ or the like, fluorine-based gas represented by CF$_4$, SF$_6$, NF$_3$ or the like, or O$_2$ may he used appropriately. Note here that although there are no specific limitations to the etching gases used, it is suitable here to use BCl$_3$ and Cl$_2$ and O$_2$. A gas flow rate of the above gas is set at 65/10/5 sccm while RF (13.56 MHz) electrical power of 450 W is supplied to the coiled electrode at a pressure of 1.2 Pa to generate plasma. RF (13.56 MHz) electric power of 300 W is supplied to the substrate side (sample stage) also to thereby apply a substantially negative self-bias voltage.

Subsequently, CF$_4$ and Cl$_2$ plus O$_2$ are used as etching gas to perform etching for about 30 seconds while a gas flow rate is set at 25/25/10 sccm and RF (13.56 MHz) electric power of 500 W is applied to the coiled electrode at a pressure of 1 Pa to thereby produce a plasma. Also, RF (13.56 MHz) electric power of 20 W is applied to the substrate side (sample stage) to thereby apply a substantially negative self-bias voltage.

In this way, the first electrodes 112a to 115a, the second electrodes 112b to 115b, and the third electrodes 112c to 115c, are etched to thus form second shaped gate electrodes 120 to 123 (fourth electrodes 120a to 123a, fifth electrodes 120b to 123b, and sixth electrodes 120c to 123c) which consist of the fourth electrode, fifth electrode and sixth electrode.

Then, a second doping process is performed to add an n-type impurity element to the semiconductor layers 103 to 106. In this process, the second shaped gate electrodes 120 to 123 are used as a mask to form n-type impurity regions 124 to 127 containing therein the n-type impurity element at a concentration of $1\times10^{17}$ to $1\times10^{20}$/cm$^3$, an n-type impurity region (B). At this time, it is considered that there is also the possibility that an impurity element is added to the semiconductor layer through tapered portion of the fourth electrode and the gate insulating film to form an impurity region overlapping the second shaped gate electrode.

Subsequently, a region that will later become an n-channel type TFT is covered with masks 128 and 129, and then a third doping process is performed for doping into the semiconductor layers 104 and 106 an impurity element that gives p-type (referred to hereinafter as p-type impurity element). In the third doping process, the second shaped conductive layers are also used as a mask to dope the p-type impurity element in a self-alignment fashion. Then, p-type impurity regions 130 and 131 are formed, which contain the p-type impurity element at a concentration of $2 \times 10^{20}$ to $3 \times 10^{21}/cm^3$.

Here, looking at the p-type impurity regions 130 and 131 in detail, it can be seen that there are regions 130a and 131a containing n-type impurity element at a concentration of $1 \times 10^{20}$ to $1 \times 10^{21}/cm^3$ and regions 130b and 131b containing n-type impurity element at a concentration of $1 \times 10^{17}$ to $1 \times 10^{20}/cm^3$. However, in these impurity regions, the concentration of p-type impurity element is 1.5 to 3 times greater than the concentration of n-type impurity element, no problems occur in the case of functioning as the source region or drain region of a p-channel type TFT.

Note that the impurity region 131 is formed in a semiconductor layer which forms a holding capacitor in the pixel portion.

Up to the steps stated above, an impurity region with a conductivity type of n-type or p-type is formed in each of the semiconductor layers. Additionally, the second shaped electrode 123 becomes one electrode for the holding capacitor in the pixel portion.

Figure 5A:
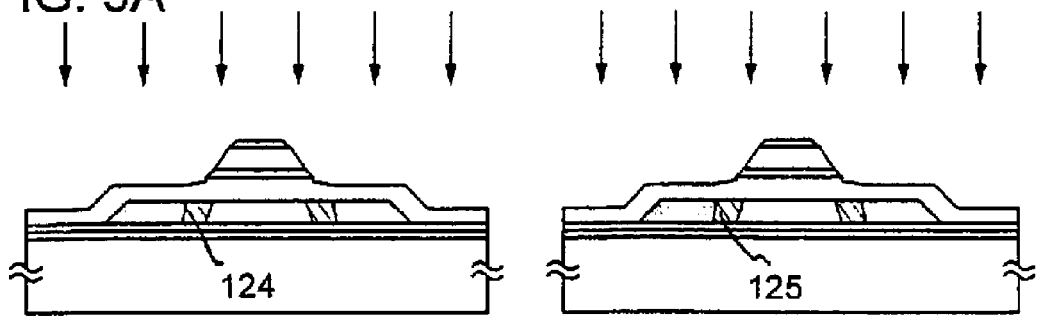
FIGS. 5A-5D are diagrams showing one example for implementation of this invention.
Figure 5B:
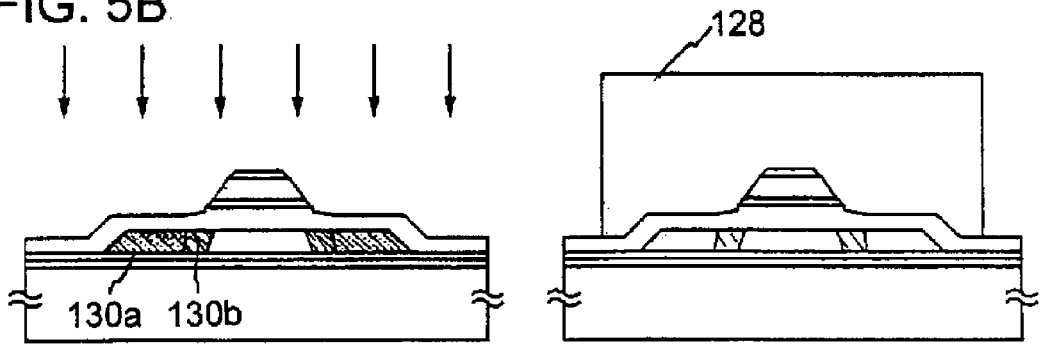
Figure 5C:
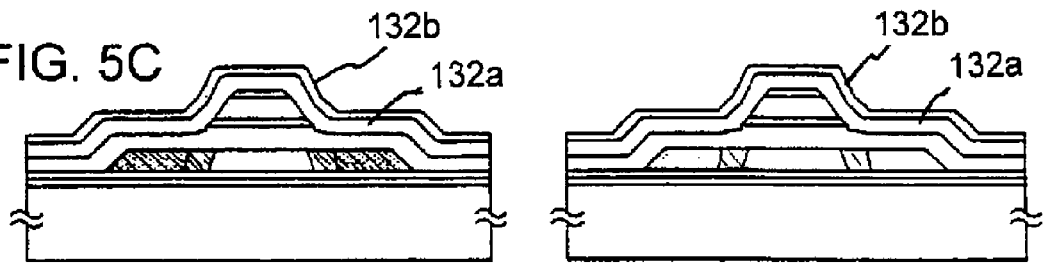

Next, a first interlayer insulating film 132a is formed (FIG. 5C and FIG. 6C). This first interlayer insulating film 132 is formed of an insulating film which contains silicon and hydrogen by plasma CVD method or sputtering method to a thickness of 100 to 200 nm. One preferred example is a silicon oxynitride film formed by plasma CVD method to have a film thickness of 150 nm. Needless to say, the first interlayer insulating film 132a should not be limited to the silicon oxynitride film, and other silicon-containing insulating films may be used in the form of a single layer or a laminated structure.

Thereafter, a process for activating the impurity elements added to respective semiconductor layers is performed with the second harmonic wave (532 nm) of YAG laser to irradiate onto the semiconductor layers. Similarly, An RTA method with a lamp light source may be used, and the semiconductor layers are heated up by radiating the lamp light source from the both surfaces of the substrate or from the substrate side.

Thereafter, an insulating film 132b of silicon nitride is formed by plasma CVD method to have a thickness of 50 to 100 nm, and thermal treatment at 410° C. is performed with a clean oven to perform hydrogenation of the semiconductor layers with hydrogen as released out of the silicon nitride film.

Figure 5D:
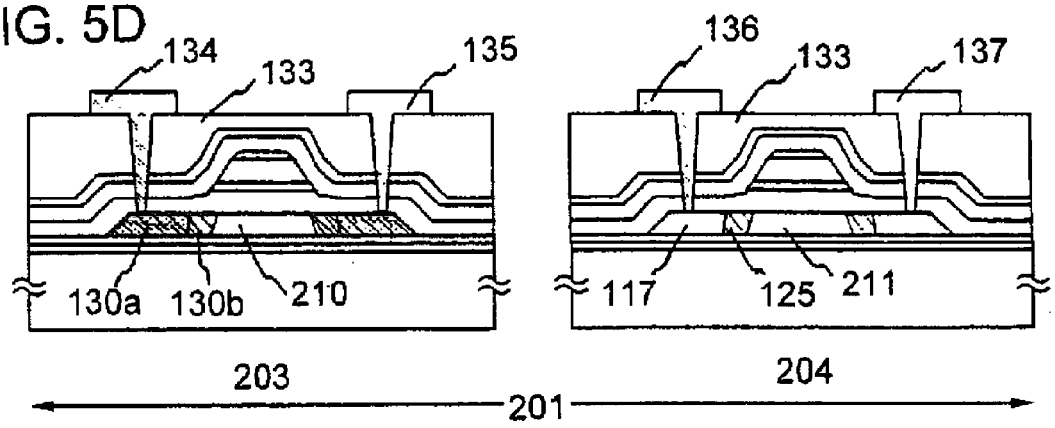

Next, on the first interlayer insulating film 132b, a second interlayer insulating film 133 of an organic insulating material is formed. Next, contact holes to reach respective impurity regions are formed. Thereafter, a material such as Al, Ti, Mo, W or the like is used to form wirings and a pixel electrode. For instance, a laminate film of a Ti film with a film thickness of 50 to 250 nm and an alloy film with a film thickness of 300 to 500 nm (alloy film of Al and Ti) is used. In this way, wirings 134 to 140 and a pixel electrode 141 are thus formed (FIG. 5D, FIG. 6D).

In the way, it is possible to form on the same substrate a drive circuit 201 which has a p-channel type TFT 203 and an n-channel type TFT 204 and a pixel portion 202 which has an n-channel type TFT 205 and a holding capacitor 206. This substrate is called the active-matrix substrate for the purpose of convenience in explanation. Note that the TFT of the pixel portion 202 may alternatively be a p-channel type TFT.

The p-channel type TFT 203 of the drive circuit 201 has a channel formation region 210, the p-type impurity region 130b and the p-type impurity region 130a which serves as either a source region or drain region. The n-channel type TFT 204 has a channel formation region 211, the n-type impurity region (B) 125 that becomes an LDD region, and the n-type impurity region (A) 117 that functions as either a source region or drain region. Using these n-channel type TFT and p-channel type TFT makes it possible to form a shift register circuit, buffer circuit, level shifter circuit, latch circuit and so forth. In particular, the structure of n-channel type TFT 204 is suitable for the buffer circuit with a high driving voltage for the purpose of preventing degradation due to hot carrier effects.

The pixel TFT 205 of the pixel portion 202 a channel formation region 212, the n-type impurity region (B) 126 that becomes an LDD region, and the n-type impurity region (A) 119 that functions as a source region or drain region. Additionally, in the semiconductor layer that functions as one electrode of the holding capacitor 206, the region to which p-type impurity 131 is doped is formed. The holding capacitor 206 is formed of the second shaped electrode 123 and semiconductor layer 106 with an insulating film (the same film as the gate insulating film) being as its dielectric.

The present invention is capable of optimizing the structure of the TFT which forms each circuit in accordance with circuit specifications required by the pixel portion and driver circuit to thereby improve the operating performance and reliability of a semiconductor device. More practically, the n-channel type TFT is designed so as to have the LDD structure in accordance with the circuit specifications required. As previously stated, the n-channel type TFT of driver circuit is designed to have an LDD structure partially overlapping with the gate electrode and to be a structure for preventing TFT degradation mainly due to hot carrier effects. Further, the n-channel type TFT of the pixel portion have an LDD structure which does not overlap the gate electrode to have a structure for mainly reducing off current. The present invention provides a technique for fabricating on the same substrate a p-channel type TFT in addition to n-channel type TFTs which have different structures with six photo-masks. In addition, forming the pixel electrode of a transparent conductive film makes it possible to form a transmission type display device although a single extra photomask is additionally required.

Embodiment 2

As an example of a combination of conductive films for the gate electrode, a semiconductor film represented by a polycrystalline silicon film with an impurity element such as phosphorus or else doped may be used as the first conductive film in place of the material as shown in Embodiment 1. Further, there are another combinations wherein the first conductive film is formed of a tungsten (W) film or molybdenum (Mo) film while the second conductive is formed of an alloy film of an aluminum (Al) film and a copper (Cu) film and the third conductive film is formed of a titanium (Ti) film, wherein the first conductive film is formed of a tantalum nitride (TaN) film while the second conductive is formed of an alloy film of aluminum (Al) and silicon (Si) with the third conductive film formed of a titanium (Ti) film, wherein the first conductive film is formed of a tantalum nitride (TaN) film while the second conductive is formed of an aluminum (Al) film, and wherein the first conductive film is formed of a titanium nitride (TiN) film while the second conductive is formed of an aluminum (Al) film and the third conductive film is formed of titanium nitride (TiN).

The above combinations are etched with the same etching gas and the same floe rate as in Embodiment 1.

Embodiment 2 may be used in combination with the process of Embodiment 1 for fabricating the gate electrode.

Embodiment 3

In Embodiment 3, the explanation is given with respect to, in the case where a conductive film of Al or containing Al as its main component is used for forming the gate electrode, a method of processing by plasma a surface of the conductive film material to thereby oxidize the surface and prevent Al from diffusing into a semiconductor film.

In an oxygen atmosphere or an atmosphere containing oxygen, plasma is performed to the surface of the conductive of Al or containing Al as its main component to oxidize the surface and form an $Al_xO_{1-x}$ film. Modifying the quality of the surface of Al through oxidation makes it possible to prevent aluminum elements from diffusing into the semiconductor layer.

This Embodiment 3 is used in combination with the process for fabricating the gate electrode Embodiment 1 and 2.

Embodiment 4

In this embodiment 4, a process of forming the semiconductor layer of a TFT is explained with reference to FIG. 7. It should be noted that the crystallization means in Embodiment 4 is a technique disclosed in Embodiment 1 of Japanese Patent Laid-Open No. 130652/1995.

First, on a substrate (glass substrate in Embodiment 4) 401, an insulating base film 402 formed of a silicon oxynitride film with a thickness of 200 nm and an amorphous semiconductor film (amorphous silicon film in Embodiment 4) 403 with a thickness of 200 nm are formed. The insulating base film and amorphous semiconductor film may be formed continuously without being opened to the atmospheric air.

Figure 7A:
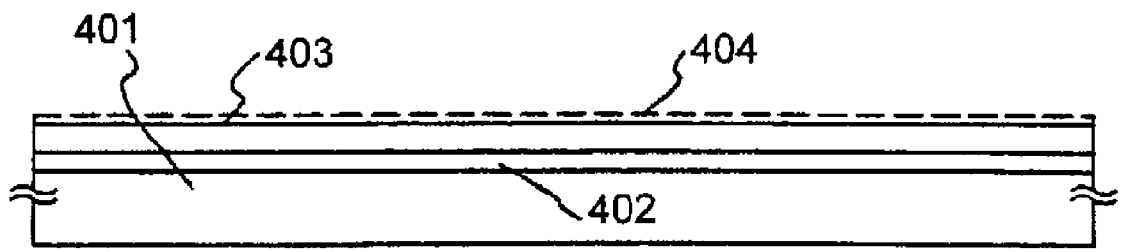
FIGS. 7A-7D are diagrams showing one example for implementation of this invention.

Next, with spin coat method, an aqueous solution (nickel acetate water solution) which contains a 10 ppm by weight of catalytic element (in Embodiment 4, nickel) conversion applied thereto, thereby to form a catalytic element-containing layer 404 on the entire surface of the amorphous semiconductor film 403. Examples of the usable catalytic element here include, although not limited to, iron (Fe), nickel (Ni), cobalt (Co), ruthenium (Ru), rhodium (Rh), palladium (Pd), osmium (Os), iridium (Ir), platinum (Pt), copper (Cu), and gold (Au) (FIG. 7A).

Further, although the method of adding nickel by spin coat method is used in Embodiment 4, there may be employed a means of using an evaporation method or a sputter method to form a thin-film containing a catalytic element (nickel in the case of this embodiment) on the amorphous semiconductor film.

Figure 7B:
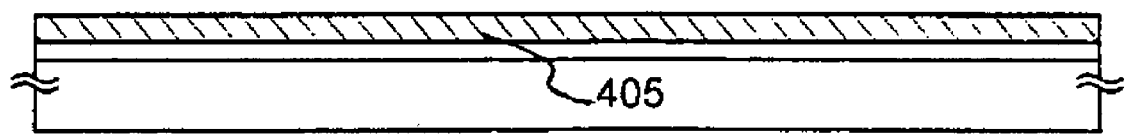

Next, prior to the process of crystallization, a thermal treatment is performed at a temperature of 400 to 500° C. for about 1 hour to desorb hydrogen from the film. Thereafter, a thermal treatment at 500 to 650° C. (preferably, 550 to 570° C.) for 4 to 12 hours (preferably, 4 to 6 hours) is performed, and in Embodiment 4, the thermal treatment is performed at 550° C. for 4 hours to a crystalline semiconductor film (crystalline silicon film, in Embodiment 4) 405 (FIG. 7B).

Note here that a laser annealing process (first optical annealing) which is similar to that of Embodiment 1 may be performed to improve the crystallinity of the crystalline semiconductor film 405.

Figure 7C:
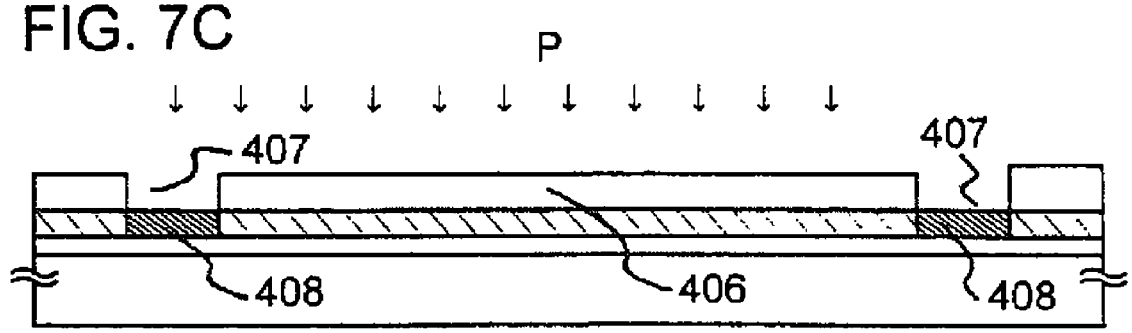

Next, a gettering process for removing the nickel used in the crystallization process from the crystalline silicon film is performed. First, on the surface of the crystalline semiconductor film 405, an insulating mask film 406 is formed to have a thickness of 150 nm, and openings 407 are formed by patterning. Then, a process of doping an element (in Embodiment 4, phosphorus) belonging to the XV group of the periodic table to an exposed portion of the crystalline semiconductor film, and gettering regions 408 containing phosphorus at a concentration of $1\times10^{19}$ to $1\times10^{20}$ atoms, $cm^3$ are formed (FIG. 7C).

Figure 7D:
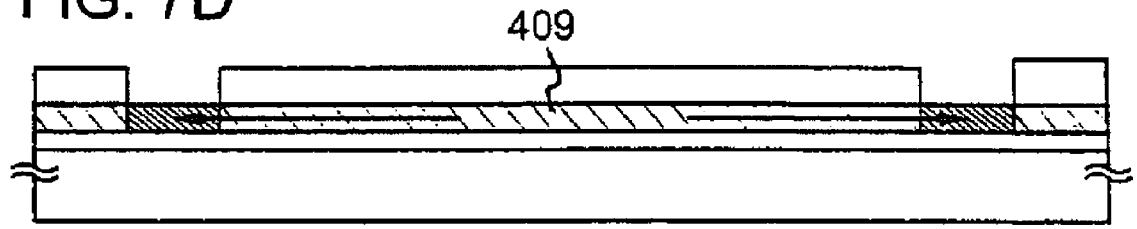

Next, a thermal treatment is performed in a nitrogen atmosphere at 450 to 650° C. (preferably, 500 to 550° C.) for 4 to 24 hours (preferably, 6 to 12 hours). With this thermal treatment, the nickel within the crystalline semiconductor film moves in the directions of arrows and then is captured in the gettering region 408 by gettering actions of the phosphorus. To be brief, since the nickel is removed from within the crystalline semiconductor film, it is possible to reduce the concentration of the nickel contained in the crystalline semiconductor film 409 to a level less than or equal to $1\times10^{17}$ atoms/$cm^3$, and preferably $1\times10^{16}$ atoms/$cm^3$ or less (FIG. 7D).

The crystalline semiconductor film 409 thus formed in the way stated above is a crystalline semiconductor film with noticeably excellent crystallinity since a catalytic element (here, nickel) for accelerating crystallization. Additionally, the catalytic element is removed away by gettering action of the phosphorus after the crystallization, the concentration of the catalytic element within the crystalline semiconductor film 409 (except gettering regions) is less than or equal to $1\times10^{17}$ atoms/$cm^3$, and preferably $1\times10^{16}$ atoms/$cm^3$ or below.

Note here that Embodiment 4 is characterize in that the gettering regions (the regions containing an impurity element belonging to the XV group of the periodic table at a high concentration) are formed in certain regions which are not become active layers after forming the crystalline semiconductor film using a catalytic element, and that the catalytic element used for the crystallization is subjected to gettering by thermal treatment.

The structure of Embodiment 4 is usable in combination with the crystallization process of the semiconductor film shown in Embodiment 1 and the manufacturing process of the gate electrode indicated in Embodiment 2.

Embodiment 5

In Embodiment 5, a process of forming a semiconductor layer of a TFT with reference to FIG. 8. Practically, the technique disclosed in Published Japanese Patent Laid-Open No. 247735/1996 (U.S. patent application Ser. No. 09/034, 041) is employed.

First, on a substrate (glass substrate in Embodiment 5) 501, an insulating base film 502 formed of a silicon oxynitride film with a thickness of 200 nm and an amorphous semiconductor film (amorphous silicon film in Embodiment 5) 503 with a thickness of 200 nm are formed. This process is alterable in such a way that the dielectric undercoat film and amorphous semiconductor film are formed continuously without being opened to the atmospheric air.

Next, an insulating mask film 504 of a silicon oxide film is formed to have a thickness of 200 nm, and an opening 505 is formed.

Figure 8A:
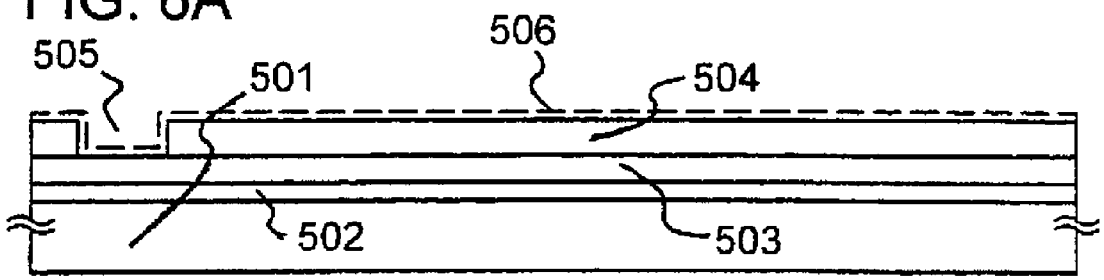
FIGS. 8A-8D are diagrams showing one example for implementation of this invention.

Next, an aqueous solution (nickel acetate water solution) containing 100 ppm by weight of catalytic element (nickel in Embodiment 5) is applied by spin coating method to form a catalytic element-containing layer 506. At this time, the catalytic element-containing layer 506 is selectively brought into contact with the amorphous semiconductor film 503 in a region of the opening 505. Examples of the usable catalytic element here include, although not limited to, iron (Fe), nickel (Ni), cobalt (Co), ruthenium (Ru), rhodium (Rh), palladium (Pd), osmium (Os), iridium (Ir), platinum (Pt), copper (Cu), and gold (Au) (FIG. 8A).

Although the method of adding nickel by spin coat method is used in Embodiment 5, there may be employed a means of an evaporation method or a sputter method to form on the amorphous semiconductor film a thin-film including a catalytic element (nickel in the case of Embodiment 5).

Figure 8B:
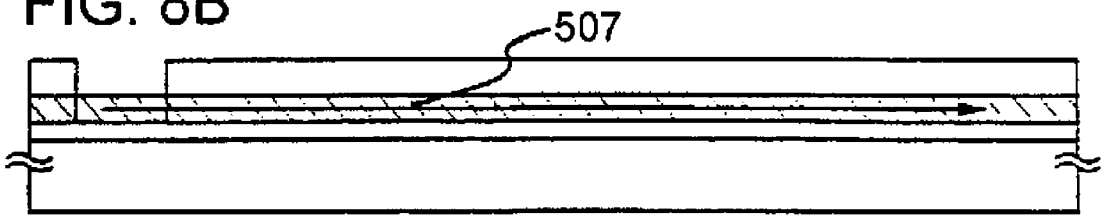

Next, prior to execution of the crystallization process, a thermal treatment is performed at 400 to 500° C. for about 1 hour to desorb hydrogen from within the film, and a thermal treatment at 500 to 650° C. (preferably, 550 to 600° C.) for 6 to 16 hours (preferably, 8 to 14 hours), at 570° C. for 14 hours in Embodiment 5. As a result, crystallization progresses in a direction (the direction as indicated by arrow) which is approximately parallel to the substrate with the opening 505 as a start point, thereby to form a crystalline semiconductor film (in Embodiment 5, crystalline silicon film) 507 with alignment of macro crystal growth directions (FIG. 8B).

Figure 8C:
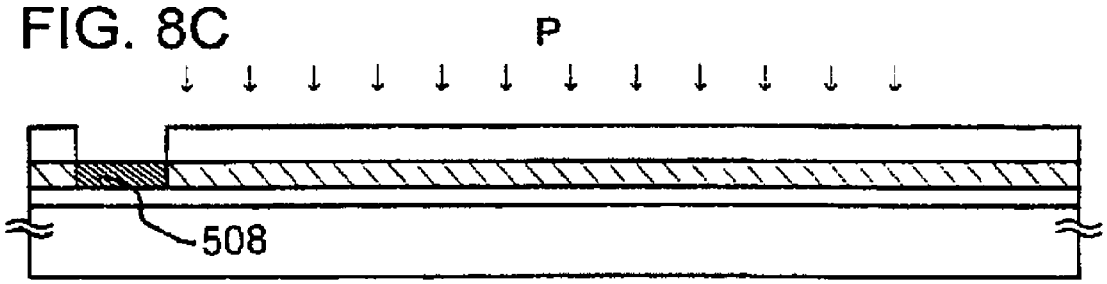

Next, a gettering process is performed for removing the nickel used in the crystallization process from the polycrystalline silicon film. In Embodiment 5, a process of doping an element (phosphorus, in Embodiment 5) which belongs to the XV group of the periodic table with the previously formed dielectric mask film 50 used as a mask, thus to form a gettering region 508 which contains therein phosphorus with a concentration of $1\times10^{19}$ to $1\times10^{20}$ atoms/cm$^3$ in the crystalline semiconductor film thus exposed at the opening 505 (FIG. 8C).

Figure 8D:
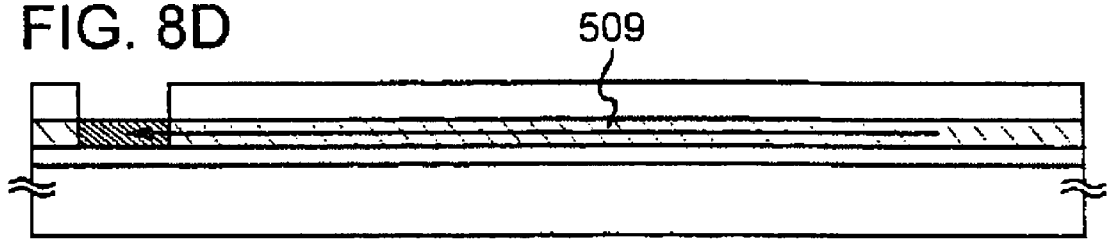

Next, a thermal treatment in a nitrogen atmosphere at 450 to 650° C. (preferably, 500 to 550° C.) for 4 to 24 hours (preferably 6 to 12 hours) is conducted. With the thermal treatment, the nickel within the crystalline semiconductor film moves in a direction of arrow, and then is captured in the gettering region 508 by gettering actions of the phosphorus. To be brief, the nickel is removed from the crystalline semiconductor film: thus, and it is possible to reduce the concentration of the nickel contained in the crystalline semiconductor film 509 to the intended level that is less than or equal to $1\times10^{17}$ atoms/cm$^3$, and preferably $1\times10^{16}$ atoms/cm$^3$ or less (FIG. 8D).

The crystalline semiconductor film 509 thus formed in the way stated above is formed of a crystalline semiconductor film which is noticeably excellent in crystallinity for selectively doping a catalytic element (here, nickel) for accelerating crystallization. More practically, the crystalline semiconductor film has a crystal structure in which stem-shaped or pole-like crystals are aligned while with specific directional properties. Additionally, the catalytic element is removed by gettering actions of the phosphorus after the crystallization, and the concentration of the catalytic element remaining within the crystalline semiconductor film 509 is expected to stay at a level less than or equal to $1\times10^{17}$ atoms/cm$^3$, and preferably $1\times10^{16}$ atoms/cm$^3$ or less.

Note here that Embodiment 5 is characterized in that the gettering region (the region containing at high concentration an impurity element which belongs to the XV group of the periodic table) are formed in a certain region which is not used as an active layer after forming the crystalline semiconductor film crystallized using a catalytic element, and that the catalytic element used for the crystallization is subjected to gettering by thermal treatment.

The construction of Embodiment 5 is employable in combination with the method of fabricating semiconductor device which is indicated in Embodiments 1 and 2.

Embodiment 6

A method of forming a semiconductor layer of a TFT is described in Embodiment 6 with reference to FIGS. 9A to 9D, in which a metal element with a catalytic function is added over the entire surface of an amorphous semiconductor film for crystallizing, a semiconductor film containing a rare gas element (Ar in Embodiment 6) is formed to be used as a gettering site.

Figure 9A:
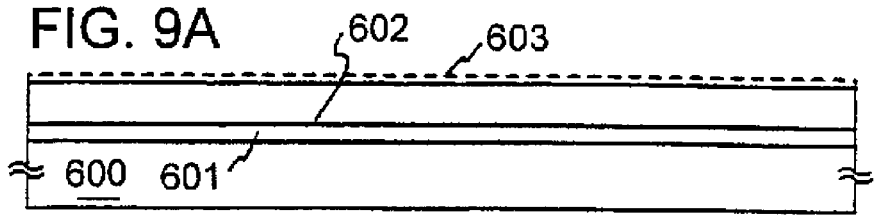
FIGS. 9A-9E are diagrams showing one example for implementation of this invention.

In FIG. 9A. Although there is no particular limit to the material of a substrate 600, barium borosilicate glass, aluminoborosilicate glass, quartz, or the like can be preferably used. On the surface of the substrate 600, an inorganic insulating film is formed into a thickness of 10 to 200 nm as a base insulating film 601. An example of a preferable base insulating film includes a silicon oxynitride film formed by plasma CVD. A first silicon oxynitride film with a thickness of 50 nm made of SiH$_4$, NH$_3$, and N$_2$O and a second silicon oxynitride film having a thickness of 100 nm made of SiH$_4$ and N$_2$O are used as the base insulating film 601. The base insulating film 601 is provided for the purpose of preventing alkali metal contained in a glass substrate from diffusing into a semiconductor film formed on the base insulating film 601. In the case of using quartz as a substrate, the base insulating film 601 may be omitted.

An amorphous semiconductor film 602 formed on the base insulating film 601 is a semiconductor material containing silicon as a main component. Typically, an amorphous silicon film, an amorphous silicon germanium film, or the like is formed into a thickness of 10 to 100 nm by plasma CVD, low-pressure CVD, or sputtering. In order to obtain a satisfactory crystal, the concentration of impurities such as oxygen and nitrogen contained in the amorphous semiconductor film 602 may he lowered to $5\times10^{18}$/cm$^3$ or less. These impurities hinder crystallization of an amorphous semiconductor, and increase the density of a trapping center and a recombination center even after crystallization. Therefore, it is desirable to use a CVD apparatus designed for ultra-high vacuum, which is subjected to mirror-surface treatment (electrical field polishing treatment) in a reaction chamber and is equipped with an oil-free vacuum exhaust system, as well as to use a material gas with a high purity.

Figure 9B:
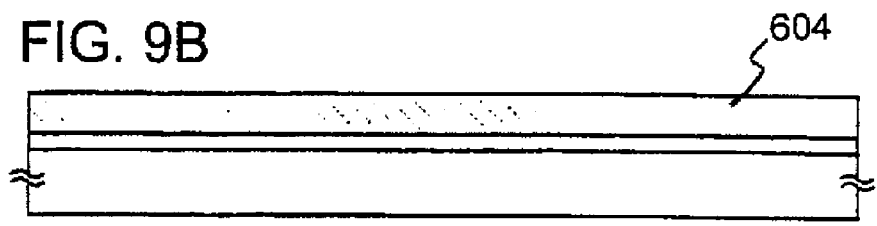

Thereafter, a metal element with a catalytic function of promoting crystallization is added to the surface of the amorphous semiconductor film 602 (FIG. 9B). Examples of such a catalytic element include iron (Fe), nickel (Ni), cobalt (Co), ruthenium (Ru), rhodium (Rh), palladium (Pd), osmium (Os), iridium (Ir), platinum (Pt), copper (Cu), gold (Au), and the like, and one kind or a plurality of kinds selected from these elements can be used. Typically, nickel is used. The amorphous semiconductor film 602 is coated with a nickel acetate solution containing 1 to 100 ppm by weight of nickel with a spinner, thereby to form a catalytic element containing layer 603. In this case, in order to enhance compatibility of the solution, the amorphous semiconductor film 602 is subjected to a surface treatment as follows: a very thin oxide film is formed with an ozone-containing aqueous solution, the oxide film is etched with a mixed solution of fluoric acid and hydrogen peroxide to obtain a clean surface, and the resultant surface is treated with an ozone-containing aqueous solution again to form a very thin oxide film. Since the surface of a semiconductor film such as silicon is hydrophobic, the surface of the amorphous semiconductor film 602 can be uniformly coated with a nickel acetate solution by forming art oxide film as described above.

Needless to say, there is no particular limit to the method of forming the catalytic element containing layer 603, and the catalytic element containing layer 603 may be formed by sputtering, evaporation, plasma treatment, or the like. Furthermore, the catalytic element containing layer 603 may be formed on the base insulating film 601 before forming the amorphous semiconductor film 602.

While the amorphous semiconductor film 602 is in contact with the catalytic element containing layer 603, a heat treatment for crystallization is conducted. As a method for the heat treatment, a furnace annealing using an electrothermal furnace, or rapid thermal annealing (hereinafter, referred to as "RTA") using a halogen lamp, a metal halide lamp, a xenon arc lamp, a carbon arc lamp, a high-pressure sodium lamp, a high-pressure mercury lamp, or the like are adopted. In view of productivity, RTA is preferably adopted.

Figure 9C:
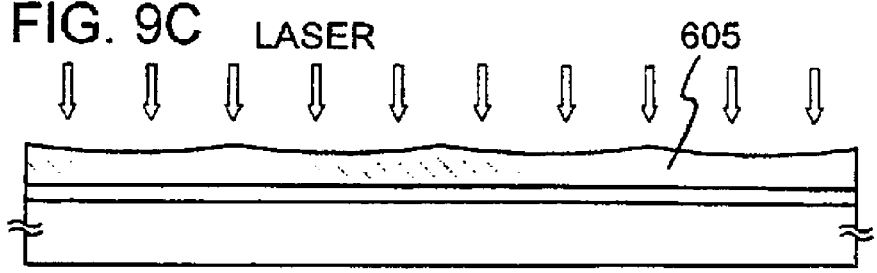

In the case of conducting RTA, a lamp light source for heating is switched on for 1 to 60 seconds, preferably 30 to 60 seconds and lighting is repeated 1 to 10 times, preferably 2 to 6 times. Although the light-emitting intensity of a lamp light source is arbitrarily set: the intensity is set in order that the semiconductor film is rapidly heated up to about 600° C. to 1000° C. preferably about 650° C. to about 750° C. Even at such a high temperature, only the semiconductor film is rapidly heated, and the substrate 600 itself is not strained to be deformed. Thus, the amorphous semiconductor film is crystallized to obtain a crystalline semiconductor film 604 as shown in FIG. 9C. Such crystallization can be achieved by providing the catalytic element containing layer 603.

In the case of using furnace annealing as the other method, prior to the heat treatment for crystallization, the amorphous semiconductor film 602 is subjected to a heat treatment at 500° C. for about one hour, whereby hydrogen contained in the amorphous semiconductor film 602 is released. Then, a heat treatment is conducted in a nitrogen atmosphere at 550° C. to 600° C. preferably at 580° C. for four hours, using an electrothermal furnace, and thus the amorphous semiconductor film 602 is crystallized. Accordingly, the crystalline semiconductor film 604 as shown in FIG. 9C is formed.

In order to enhance a crystallization ratio (ratio of a crystal component to the entire volume of the film), and repair defects remaining in the crystal grains, it is also effective to irradiate the crystalline semiconductor film 604 with laser light as shown in FIG. 9C. As the laser, excimer laser light with a wavelength of 400 nm or less, the second harmonic or the third harmonic of YAG laser is used. In any case, the crystalline semiconductor film 604 may be subjected to a laser treatment with an overlap ratio of 90 to 95% by using pulse laser light with a repeating frequency of about 10 to 1000 Hz and condensing the laser light at 100 to 400 mJ/cm$^2$ with an optical system.

In a crystalline semiconductor film 605 thus obtained, a catalytic element (herein, nickel) remains. Although not uniformly distributed in the film, the catalytic element remains at an average concentration over $1\times10^{19}$/cm$^3$. Needless to say, even in such a state, it is possible to form various semiconductor devices such as a TFT. However, the catalytic element is removed by gettering using the following method.

Figure 9D:
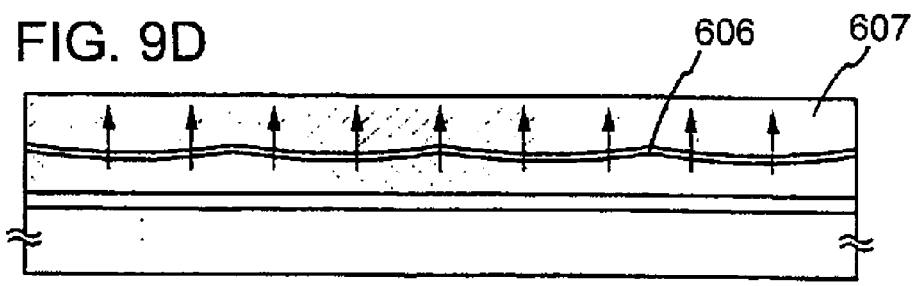

First, as shown in FIG. 9D, a thin layer 606 is formed on the surface of the crystalline semiconductor film 605. In the present specification, the thin layer 606 provided on the crystalline semiconductor film 605 is provided to prevent the first semiconductor film 605 from being etched when a gettering site is removed later. Therefore, the thin layer 606 will be referred to as a "barrier layer 606".

The thickness of the barrier layer 606 is set to he about 1 to 10 nm, and chemical oxide formed by a treatment with ozone water may be used as a barrier layer simply. Furthermore, even by a treatment with an aqueous solution containing a mixture of sulfuric acid, hydrochloric acid, or nitric acid together with hydrogen peroxide, a chemical oxide film can be similarly formed. Alternatively, a plasma treatment in an oxidizing atmosphere, or oxidation treatment in which ozone is generated by irradiating UV-light in an oxygen-containing atmosphere or the like may be conducted. Furthermore, a thin oxide film is formed to obtain a harrier layer by heating at about 200° C. to about 350° C. with a clean oven. Alternatively, an oxide film with a thickness of about 1 to 5 nm is deposited to obtain a harrier layer by plasma CVD, sputtering, evaporation, or the like. In any case, a film which allows a catalytic element to move to a gettering site side in the gettering process and does not allow an etchant to penetrate into the film (protects the crystalline semiconductor film 605 from an etchant) in the removing process of a gettering site may be used. For example, a chemical oxide film formed by a treatment with ozone water, a silicon oxide film (SiO$_x$), or a porous film may be used.

Then, as a gettering site 607, a second semiconductor film (typically, an amorphous silicon film) containing a rare gas element at a concentration of $1\times10^{20}$/cm$^3$ or more is formed on the barrier layer 606 to have a thickness of 25 to 250 nm by sputtering. Since the gettering site 607 is removed later, a low-density film is preferably formed so as to obtain a large selection ratio of etching with respect to the crystalline semiconductor film 605.

In the case of forming the gettering site 607 by sputtering under the conditions that a gas (Ar) flow rate is 50 (sccm), a film formation power is 3 kW, a substrate temperature is 150° C., and the film formation pressure is varied from 0.2 to 1.0 Pa, the concentration of a rare gas in the gettering site 607 is set $1\times10^{19}$/cm$^3$ to $1\times10^{22}$/cm$^3$, preferably $1\times10^{20}$/cm$^3$ to $1\times10^{21}$/cm$^3$, more preferably $5\times10^{20}$/cm$^3$, and allows a gettering effect.

As being inactive itself in a semiconductor film, a rare gas element does not adversely influence the crystalline semiconductor film 605. As a rare gas element, one kind or a plurality of kinds selected from helium (He), neon (Ne), argon (Ar), krypton (Kr), and xenon (Xe) are used. The present invention is characterized in that these rare gas elements are used as ion sources for forming a gettering site, and a semiconductor film containing these elements is formed to obtain a gettering site.

In order to surely achieve gettering, it is required to conduct a heat treatment thereafter. The heat treatment is conducted by furnace annealing or RTA. In the case of adopting furnace annealing, a heat treatment is conducted at 450° C. to 600° C. for 0.5 to 12 hours in a nitrogen atmosphere. In the case of RTA, a lamp light source for heating is switched on for 1 to 60 seconds, preferably 30 to 60 seconds and lighting is repeated 1 to 10 times, preferably 2 to 6 times. Although the light-emitting intensity of a lamp light source is arbitrarily determined, the intensity is set in order that semiconductor film is rapidly heated to about 600° C. to about 1000° C. preferably about 700° C. to about 750° C.

During gettering, a catalytic element in a region to be gettered (trap site) is released by heat energy, and moved to a gettering site by diffusion. Thus, gettering depends upon a treatment temperature, and proceeds in a shorter period of time at a higher temperature. According to the present invention, the distance where a catalytic element moves during gettering corresponds to approximately the thickness of a semiconductor film, as shown by an arrow in FIG. 9D, whereby gettering can be completed in a relatively short period of time.

Even in the above-mentioned heat treatment, the semiconductor film 607 containing a rare gas element at a concentration of $1\times10^{19}/cm^3$ to $1\times10^{21}/cm^3$, preferably $1\times10^{20}/cm^3$ to $1\times10^{21}/cm^3$, more preferably $5\times10^{20}/cm^3$ is not crystallized. The reason for this is considered as follows: a rare gas element remains in a semiconductor film without being released again even in the above-mentioned range of a heat treatment temperature, thereby to inhibit crystallization of the semiconductor film.

After completing gettering, the amorphous semiconductor 607 is removed by selectively etching. The etching can be conducted by dry etching with $ClF_3$, without using plasma, or wet etching with an alkaline solution such as hydrazine and an aqueous solution containing tetraethyl ammonium hydroxide $((CH_3)_4NOH)$. At this time, the barrier layer 606 functions as an etching stopper. The barrier layer 606 may be removed with fluoric acid thereafter.

Figure 9E:
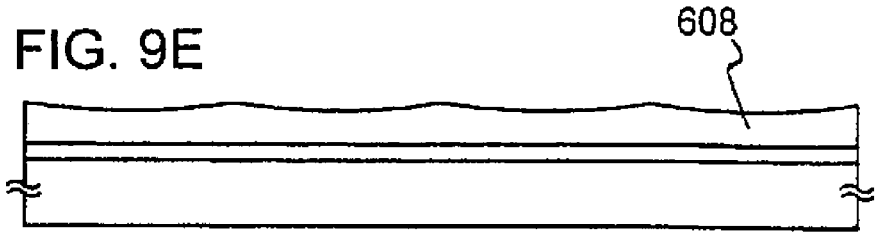

Accordingly, a crystalline semiconductor film 608 with a concentration of a catalytic element reduced to $1\times10^{17}/cm^3$ or less can be obtained as shown in FIG. 9E.

Embodiment 6 can be used by combining gettering process of the catalyst element which is executed after the formation of the crystalline semiconductor film in the method of forming the semiconductor device in Embodiments 1 or 2.

Embodiment 7

In Embodiment 7, the manufacturing process of a semiconductor layer of a TFT is described using FIG. 10, in which a metal element with a catalytic function is added to the entire surface of an amorphous semiconductor film for crystallizing while gettering is simultaneously conducted.

Figure 10A:
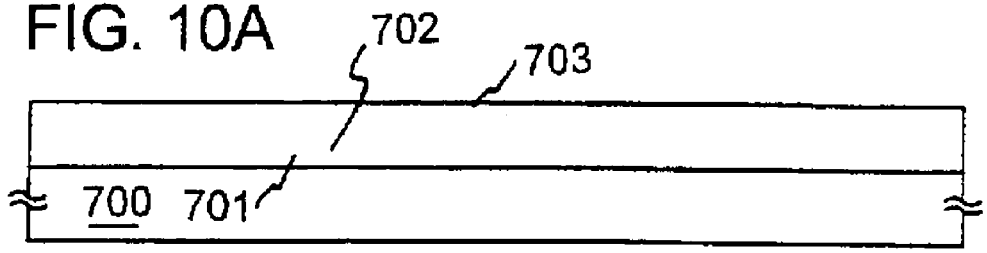
FIGS. 10A-10D are diagrams showing one example for implementation of this invention.

First, as shown in FIG. 10A, a catalytic element containing layer 702 is formed on a base insulating film 701. At this time, an aqueous solution containing a catalytic element or alcohol solution may be used with a spinner. Alternatively, the catalytic element containing layer 702 may be formed by sputtering, evaporation, a plasma treatment, or the like.

Figure 10B:
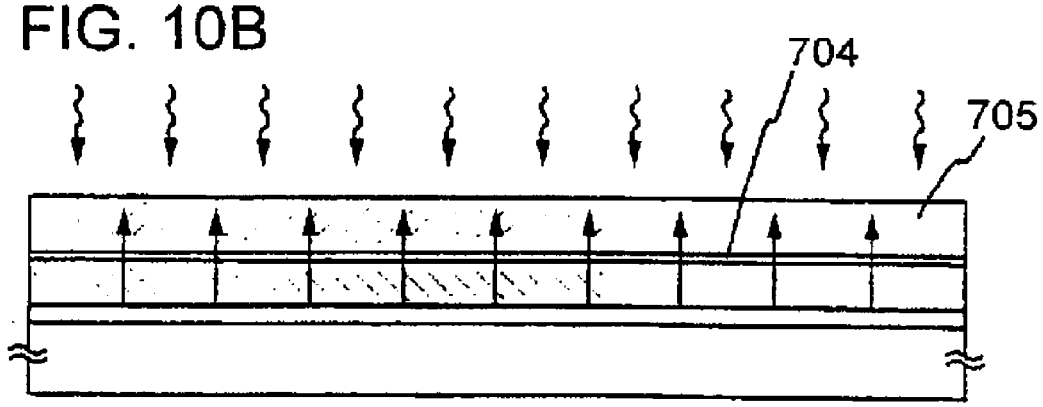
Figure 10C:
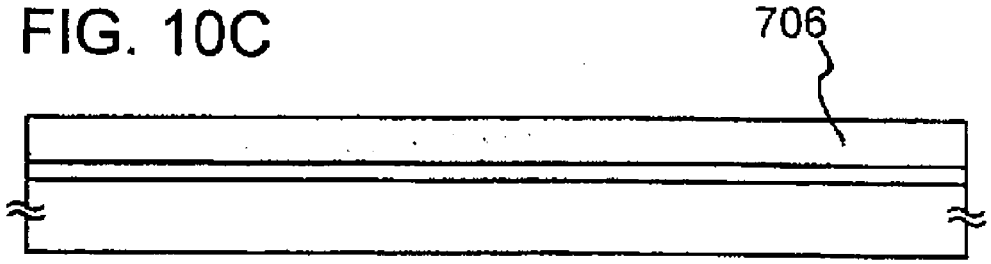

Thereafter, an amorphous semiconductor film 703 is formed into a thickness of 10 to 100 nm by plasma CVD, low-pressure CVD, or sputtering, as shown in FIG. 10B. Furthermore, a barrier layer 704 is formed. The method of forming these films is the same as that in Embodiment 6.

Then, a semiconductor film 705 containing a rare gas element in a concentration of $1\times10^{19}/cm^3$ to $1\times10^{22}/cm^3$, preferably $1\times10^{20}$ to $1\times10^{21}/cm^3$, more preferably $5\times10^{20}/cm^3$ is formed into a thickness of 25 to 250 nm by plasma CVD. Typically, an amorphous silicon film is selected. Since the semiconductor film 705 is removed later, a low-density film is desirably formed.

Next, a heat treatment is conducted. As a method of the heat treatment, a furnace annealing using an electrothermal furnace, or RTA using a halogen lamp, a metal halide lamp, a xenon arc lamp, a carbon arc lamp, a high-pressure sodium lamp, a high-pressure mercury lamp, or the like are conducted.

In the above-mentioned heat treatment, a catalytic element permeates into the semiconductor film 703 with an amorphous structure, and diffuses toward the semiconductor film 705 (in a direction represented by an arrow in FIG. 10B) with crystallizing the semiconductor film 703. Because of this, crystallization and gettering are simultaneously conducted by one heat treatment.

Thereafter, the semiconductor film 705 is removed by selectively etching. The etching can be conducted by dry etching with $ClF_3$, without using plasma, or wet etching with an alkaline solution such as hydrazine and an aqueous solution containing tetraethyl ammonium hydroxide $((CH_3)_4NOH)$. At this time, the barrier layer 704 functions as an etching stopper. The barrier layer 704 may be removed with fluoric acid thereafter.

Figure 10D:
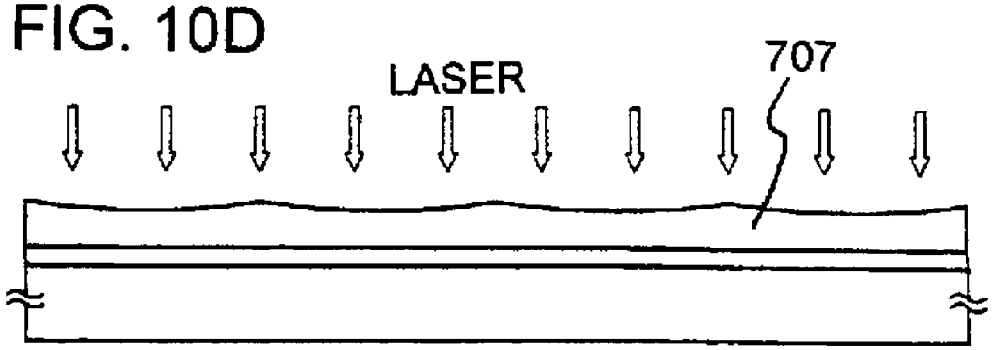

Thus, a semiconductor film (first semiconductor film) 706 with a crystal structure and a concentration of a catalytic element reduced to $1\times10^{17}/cm^3$ or less can be obtained as shown in FIG. 10D. In order to enhance the crystallinity of the crystalline semiconductor film 706, the semiconductor film 706 may he irradiated with laser light.

Thus, a crystalline semiconductor film 707 with a concentration of a catalytic element reduced to $1\times10^{17}/cm^3$ or less can be obtained as shown in FIG. 10D. Embodiment 7 can be used by combining with the manufacturing process of the crystalline semiconductor film in the method of manufacturing the semiconductor device of Embodiment 1.

Embodiment 8

In Embodiment 8, the steps to fabricate a liquid crystal module made from the active matrix substrate obtained in Embodiment 1 are described below.

An orientation film is formed on the active matrix substrate, followed by conducting rubbing processing. In Embodiment 8, before the orientation film is formed, an organic resin film such as an acrylic resin film is patterned to form column-shaped spacers at desired positions for the purpose of keeping a substrate gap. In place of the column-shaped spacers, spherical spacers may be dispersed over the entire surface of the substrate.

Then, an opposite substrate is prepared. A color filter in which a coloring layer and a light-shielding layer are provided to correspond to each pixel is formed over the opposite substrate. Further, a light-shielding layer is formed over the driving circuit. In addition, a leveling film covering the color filter and the light-shielding layer is formed. Then, an opposite electrode of a transparent conductive film is formed on the leveling film at least in the pixel portion, and an orientation film is formed over the entire surface of the opposite substrate, followed by conducting rubbing.

The active matrix substrate with the pixel portion and the driving circuit formed thereon is attached to the opposite substrate with a sealant. Filler is mixed in the sealant. Two substrates are attached to each other while a uniform gap is kept therebetween with the filler and the column-shaped spacers. Thereafter, a liquid crystal material is injected between the substrates before completely sealing with a sealant. As the liquid crystal material, a known liquid crystal material may he used. Then, with described above, the liquid crystal module is completed. Further, if necessary, the active matrix substrate or the opposite substrate are divided into the required shape. Furthermore, a polarizing plate etc. is attached by using a known method. Then, a FPC is attached by using a known method.

Figure 11A:
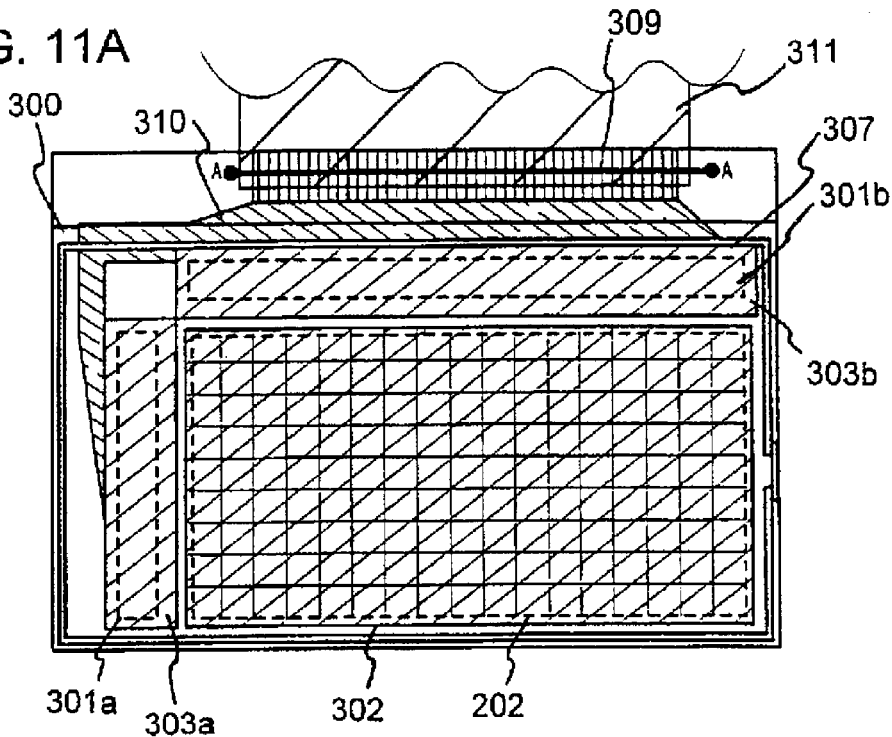
FIGS. 11A and 11B are diagrams showing one example for implementation of this invention.

The structure of the liquid crystal module obtained in such manner is described with reference of a top view of FIG. 11A.

As shown in a top view of FIG. 11, an active matrix substrate is attached to an opposite substrate 300 with a sealant 307. The active matrix substrate is provided with a pixel portion, driving circuits, an external input terminal 309 to which an FPC (Flexible Printed Circuit) 311 is attached, and a wiring 310 connecting the external input terminal to an input portion of each circuit. The opposite substrate 300 is provided with a color filter and the like.

A light-shielding layer 303a is provided at the opposite substrate side so as to be overlapped with a gate side driving circuit 301a, and a light shielding layer 303b is provided at the opposite substrate side so as to be overlapped with a source side driving circuit 301b. A color filter 302 disposed over the pixel portion 305 at the opposite substrate side is provided to have a light shielding layer and a coloring layer of each color (red (R), green (G), and blue (B)) which is corresponding to each pixel. Actually, a color display is conducted with three colors of the coloring layer of red (R), the coloring layer of green (G), and the coloring layer of blue (B). The coloring layers of the respective colors are arranged arbitrarily.

Herein, in order to conduct a color display, the color filter 302 is provided on the opposite substrate. However, the present invention is not limited thereto. A color filter may be formed over an active matrix substrate when the active matrix substrate is manufactured.

In the color filter, a light shielding layer is provided in a region between the adjacent pixels, whereby light is blocked in the region except a display region. Furthermore, the light-shielding layers 303a and 303b are provided so as to cover the driving circuits. However, covers are placed over the regions of the driving circuits when the liquid crystal display apparatus is incorporated into electronic equipment as a display portion. Therefore, the regions of the driving circuits may not be covered with the light-shielding layers. Furthermore, a light-shielding layer may be formed on an active matrix substrate when the active matrix substrate is manufactured.

Furthermore, the following may also be possible. Instead of providing the above-mentioned light-shielding layers, a plurality of stacked coloring layers constituting a color filter are appropriately disposed between the opposite substrate and the opposite electrode, whereby light is blocked in the region (gap between the respective pixel electrodes) except a display region and driving circuits.

Figure 11B:
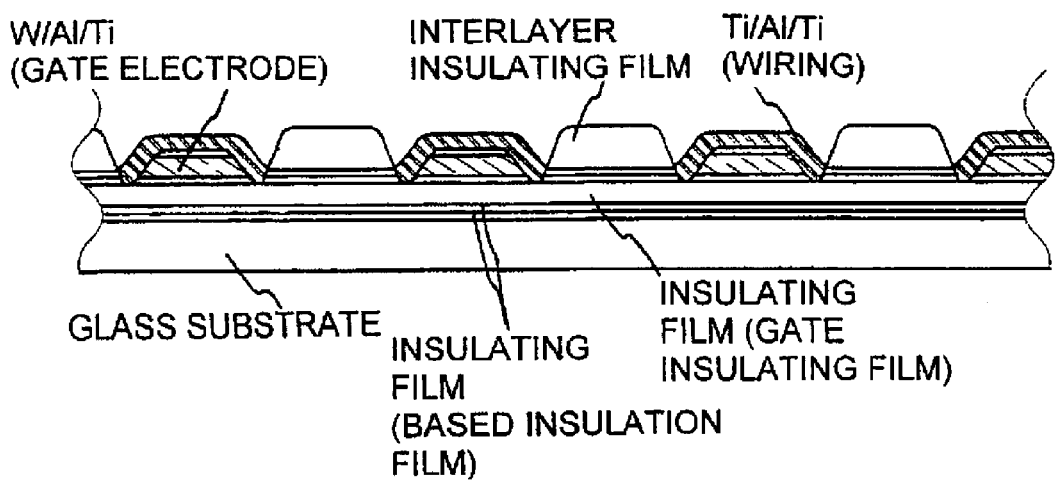

Furthermore, an FPC 311 composed of a base film and a wiring is attached to the external input terminal with anisotropic conductive resin. Furthermore, the mechanical strength of the device is enhanced with a reinforcing plate. The state taken along the line of A-A' of external input terminal portion is shown in FIG. 11B.

As mentioned above, even if a large-scale display device is formed, the problem such as a signal delay is never caused by raising the wring resistance. The reason is that the following films are laminated in order to form the gate electrode as the present invention; Al, a low resistance conductive film or the conductive film containing Al mainly, W or the conductive film containing W mainly, Ti or the conductive film containing Ti mainly. Thus, the liquid crystal module formed to contain the gate electrode of the present invention can be used as display portions of various electronic equipments.

Embodiment 9

The CMOS circuit and the pixel portion formed by implementing the invention can be used in active matrix type liquid crystal display device (liquid crystal display device). That is, the present invention can be implemented in all of electronic apparatuses integrated with the electro-optical devices at display portions thereof.

As such electronic apparatus, there are pointed out a video camera, a digital camera, a projector (rear type or front type), a head mount display (goggle type display), a personal computer, a portable information terminal (mobile computer, portable telephone or electronic book) and the like. Examples of these are shown in FIGS. 12A through 12F, FIGS. 13A through 13D and FIGS. 14A through 14C.

FIG. 12A shows a personal computer including a main body 2001, an image input portion 2002, a display portion 2003 and a keyboard 2004.

FIG. 12B shows a video camera including a main body 2101, a display portion 2102, a voice input portion 2103, operation switches 2104, a battery 2105 and an image receiving portion 2106.

FIG. 12C shows a mobile computer including a main body 2201, a camera portion 2202, an image receiving portion 2203, an operation switch 2204 and a display portion 2205.

FIG. 12D shows a goggle type display including a main body 2301, a display portion 2302 and an arm portion 2303.

FIG. 12E shows a player using a record medium recorded with programs (hereinafter, referred to as record medium) including a main body 2401, a display portion 2402, a speaker portion 2403, a record medium 2404 and an operation switch 2405. The player uses DVD (Digital Versatile Disc) or CD as the record medium and can enjoy music, enjoy movie and carry out game or Internet.

FIG. 12F shows a digital camera including a main body 2501, a display portion 2502, an eye contact portion 2503, operation switches 2504 and an image receiving portion (not illustrated).

Figure 13A:
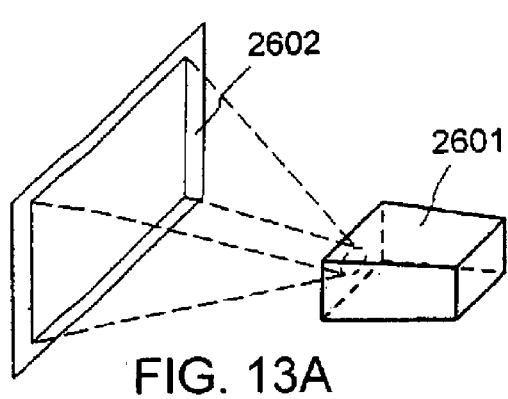
FIGS. 13A-13D are diagrams showing examples of electrical equipment.

FIG. 13A shows a front type projector including a projection apparatus 2601 and a screen 2602.

Figure 13B:
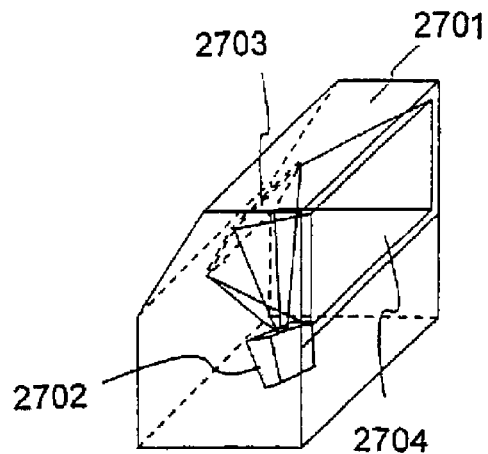

FIG. 13B shows a rear type projector including a main body 2701, a projection apparatus 2702, a mirror 2703 and a screen 2704.

Figure 13C:
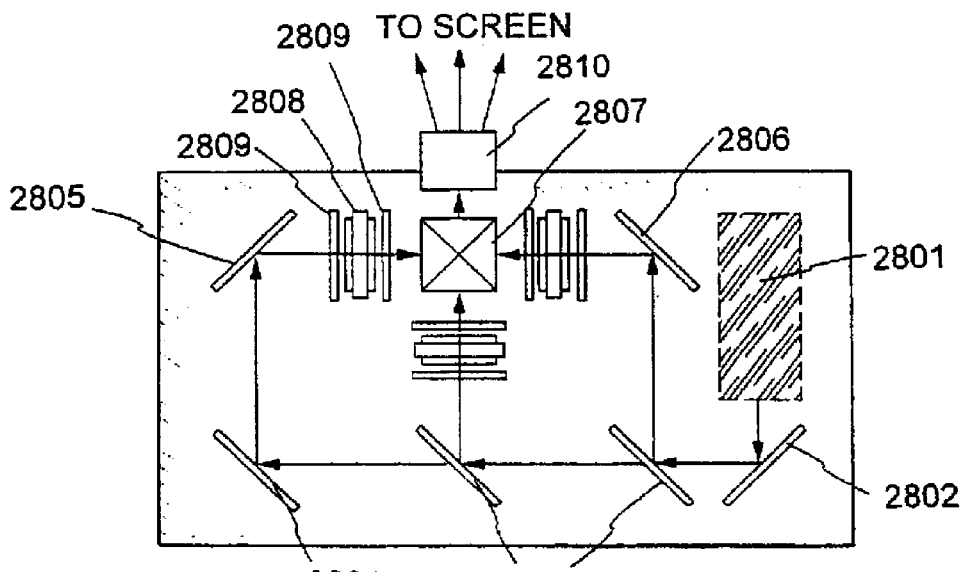

Further, FIG. 13C is a view showing an example of a structure of the projection apparatus 2601 and 2702 in FIG. 13A and FIG. 13B, respectively. The projection apparatus 2601 or 2702 is constituted by a light source optical system 2801, mirrors 2802, and 2804 through 2806, a dichroic mirror 2803, a prism 2807, a liquid crystal display apparatus 2808, a phase difference plate 2809 and a projection optical system 2810. The projection optical system 2810 is constituted by an optical system including a projection lens. Although the embodiment shows an example of three plates type, the embodiment is not particularly limited thereto but may be of, for example, a single plate type. Further, a person of executing the embodiment may pertinently provide an optical system such as an optical lens, a film having a polarization function, a film for adjusting a phase difference or an IR film in an optical path shown by arrow marks in FIG. 13C.

Figure 13D:
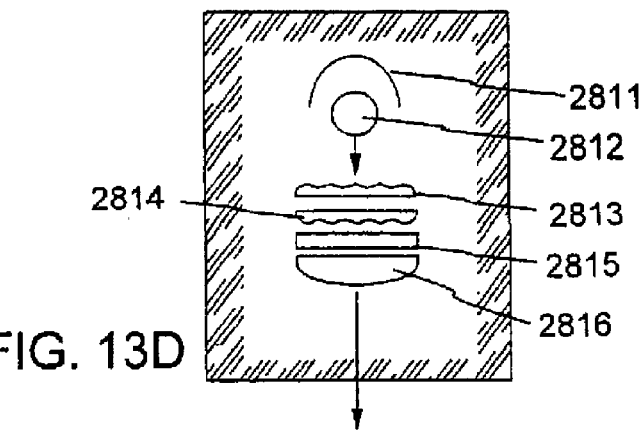

Further, FIG. 13D is a view showing an example of a structure of the light source optical system 2801 in FIG. 13C. According to the embodiment, the light source optical system 2801 is constituted by a reflector 2811, a light source 2812, lens arrays 2813 and 2814, a polarization conversion element 2815 and a focusing lens 2816. Further, the light source optical system shown in FIG. 13D is only an example and the embodiment is not particularly limited thereto. For example, a person of executing the embodiment may pertinently provide an optical system such as an optical lens, a film having a polarization function, a film for adjusting a phase difference or an IR film in the light source optical system.

However, according to the projectors shown in FIGS. 13A, 13B and 13C, there is shown a case of using a transmission type electronic apparatus and an example of applying a reflection type electronic apparatus is not illustrated.

Figure 14A:
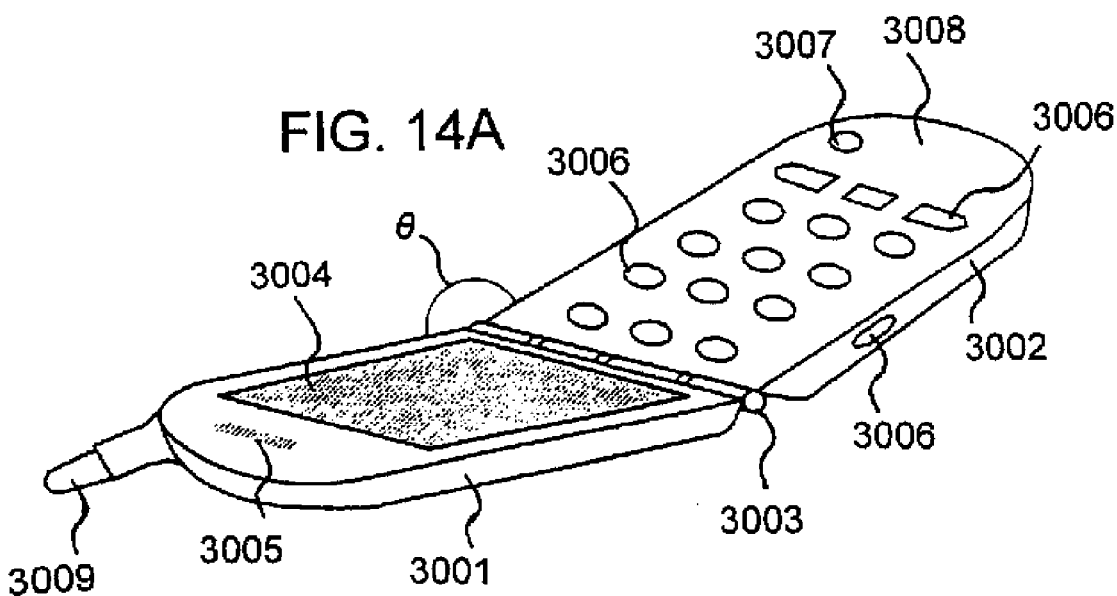
FIGS. 14A-14C are diagrams showing examples of electrical equipment.

FIG. 14A shows a mobile telephone including a display panel 3001, an operation panel 3002. The display panel 3001 and the operation panel 3002 are connected to each other in the connecting portion 3003. In the connecting panel 3003, the angle θ of a face which is provided the display portion 3004 of the display panel 3001 and a face which is provided the operation key 3006 of the operation panel 3002 can be changed arbitrary. Further, a voice output portion 3005, an operation key 3006, a power source switch 3007 and a sound input portion 3008 are also included.

Figure 14B:
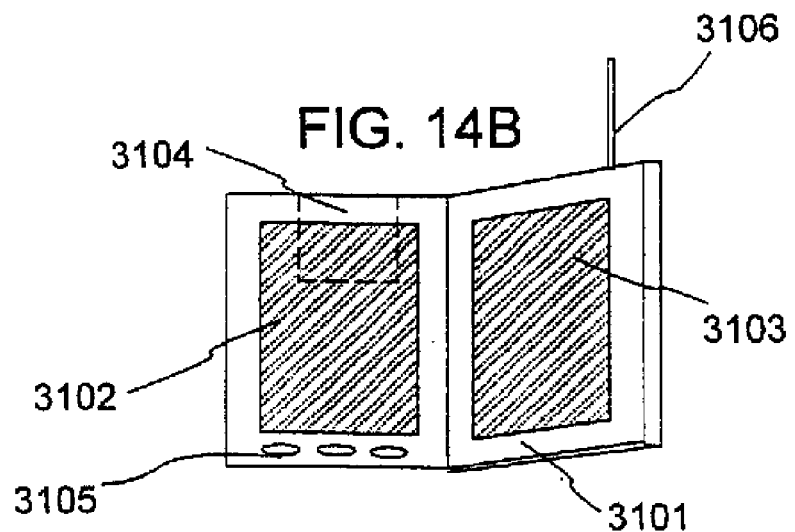

FIG. 14B shows a portable book (electronic book) including a main body 3101, display portions 3102 and 3103, a record medium 3104, an operation switch 3105 and an antenna 3106.

Figure 14C:
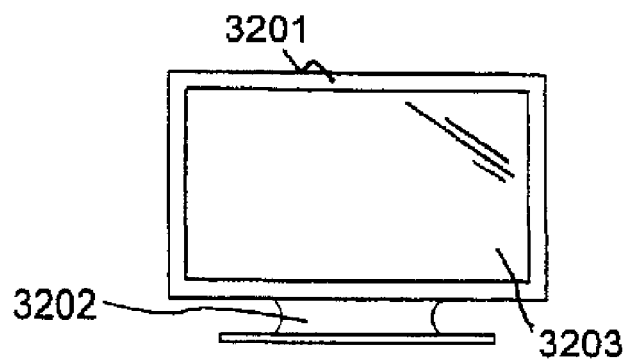

FIG. 14C shows a display including a main body 3201, a support base 3202 and a display portion 3203. The display according to the invention is advantageous particularly in the case of large screen formation and is advantageous in the display having a diagonal length of 10 inch or more (particularly, 30 inch or more).

As has been described, the range of applying the invention is extremely wide and is applicable to electronic apparatus of all the fields. Further, the electronic apparatus of this embodiment can be realized by using any constitution comprising any combinations of Embodiments 1 to 8.

With the disclosed technique for fabricating wirings by using the material with low resistance, it is possible to realize excellent display without problems such as signal delay and the like in display screen size in a semiconductor device represented by an active matrix type liquid crystal display device since the wiring resistance is suppressed even when the area of a pixel portion increases to result in an increase in display screen size.

As it is possible to greatly reduce the resistance of a source wiring in the pixel portion, the present invention is adaptable as a technique for fabricating large display liquid crystal display devices with diagonal 40-inch or diagonal 50-inch screen sizes.

What is claimed is:

1. A semiconductor device comprising:
a pixel portion over a substrate; and
an external input terminal portion over the substrate,
wherein the pixel portion comprises:
a semiconductor layer;
a gate electrode; and
a gate insulating film between the semiconductor layer and the gate electrode,
wherein the gate electrode comprises a laminate of a first layer, a second layer and a third layer, and the first layer is in contact with the gate insulating film, and
wherein the external input terminal portion has a first portion and a second portion, the first portion including a conductive film comprising the first layer, the second layer and the third layer, and the second portion including an interlayer insulating film,
wherein the conductive film is covered with a conductive layer, and
wherein the first portion and the second portion are arranged alternately.

2. The semiconductor device as claimed in claim 1, wherein the semiconductor layer comprises a channel formation region, a LDD region in contact with the channel formation region, and a source region or a drain region in contact with the LDD region.

3. The semiconductor device as claimed in claim 1, wherein the first layer is formed of a conductive film comprising tungsten or a material including tungsten as its main component, the second layer is formed of a conductive film comprising copper or a material including copper as its main component, and the third layer is formed of a conductive film comprising titanium or a material including titanium as its main component.

4. The semiconductor device as claimed in claim 1, wherein the gate electrode has a taper shape.

5. The semiconductor device as claimed in claim 1, wherein the semiconductor layer is located between the substrate and the gate electrode.

6. The semiconductor device as claimed in claim 1, wherein the gate electrode is located between the semiconductor layer and the interlayer insulating film.

7. The semiconductor device as claimed in claim 1, wherein the semiconductor device is selected from the group consisting of a computer, a video camera, a digital camera, a mobile telephone, and a projector.

* * * * *

UNITED STATES PATENT AND TRADEMARK OFFICE
CERTIFICATE OF CORRECTION

| | |
|---|---|
| PATENT NO. | : 7,952,152 B2 |
| APPLICATION NO. | : 12/849866 |
| DATED | : May 31, 2011 |
| INVENTOR(S) | : Shunpei Yamazaki et al. |

It is certified that error appears in the above-identified patent and that said Letters Patent is hereby corrected as shown below:

Column 8, line 37, after "may" replace "he" with --be--;

Column 14, line 44, after "may" replace "he" with --be--;

Column 15, line 7, replace "art" with --an--;

Column 16, line 8, replace "he" with --be--;

Column 16, line 18, replace "harrier" with --barrier--;

Column 16, line 21, replace "harrier" with --barrier--;

Column 18, line 18, after "may" replace "he" with --be--;

Column 18, line 57, after "may" replace "he" with --be--.

Signed and Sealed this
Third Day of April, 2012

David J. Kappos
*Director of the United States Patent and Trademark Office*